United States Patent
Kimura et al.

(10) Patent No.: US 10,551,662 B2
(45) Date of Patent: Feb. 4, 2020

(54) DISPLAY DEVICE SUBSTRATE, DISPLAY DEVICE USING SAME

(71) Applicant: TOPPAN PRINTING CO., LTD., Taito-ku (JP)

(72) Inventors: Yukihiro Kimura, Taito-ku (JP); Kenzo Fukuyoshi, Taito-ku (JP)

(73) Assignee: TOPPAN PRINTING CO., LTD., Taito-ku (JP)

(*) Notice: Subject to any disclaimer, the term of this patent is extended or adjusted under 35 U.S.C. 154(b) by 693 days.

(21) Appl. No.: 14/973,144

(22) Filed: Dec. 17, 2015

(65) Prior Publication Data

US 2016/0103359 A1 Apr. 14, 2016

Related U.S. Application Data

(63) Continuation of application No. PCT/JP2014/064603, filed on Jun. 2, 2014.

(30) Foreign Application Priority Data

Jun. 17, 2013 (JP) .................................. 2013-126842

(51) Int. Cl.
*G02F 1/1333* (2006.01)
*G02F 1/1335* (2006.01)

(52) U.S. Cl.
CPC .. *G02F 1/133512* (2013.01); *G02F 1/133308* (2013.01); *G02F 1/133514* (2013.01); *G02F 1/133602* (2013.01)

(58) Field of Classification Search
None
See application file for complete search history.

(56) References Cited

U.S. PATENT DOCUMENTS 5,850,271 A 12/1998 Kim et al.
2009/0161051 A1* 6/2009 Fukunaga ............. G06F 3/0412
349/115

(Continued)

FOREIGN PATENT DOCUMENTS

CN 101424818 A 5/2009
JP 08109337 A * 4/1996 ............. C09B 57/04

(Continued)

OTHER PUBLICATIONS

Combined Chinese Office Action and Search Report dated May 19, 2017 in Chinese Patent Application No. 201480034264.7 (with English translation of the Office Action and English translation of Category of Cited Documents).

(Continued)

*Primary Examiner* — Edward J Glick
*Assistant Examiner* — Anthony G Quash
(74) *Attorney, Agent, or Firm* — Oblon, McClelland, Maier & Neustadt, L.L.P.

(57) ABSTRACT

A display device substrate includes a transparent substrate, a frame member disposed on the transparent substrate and formed in a frame region surrounding a display region, a first transparent resin layer formed on the transparent substrate having the frame member formed thereon, a black matrix formed on the first transparent resin layer such that the display region is divided into plural openings in a matrix form, and a second transparent resin layer formed on the first transparent resin layer on which the black matrix is formed. The frame member includes carbon as a major colorant and has a light shielding property, and the black matrix includes at least one organic pigment as a major colorant.

4 Claims, 9 Drawing Sheets

(56) References Cited

U.S. PATENT DOCUMENTS

| | | | | |
|---|---|---|---|---|
| 2011/0242469 | A1* | 10/2011 | Kawamura | G02F 1/133512 349/138 |
| 2012/0168785 | A1* | 7/2012 | Tanaka | G02F 1/133512 257/89 |
| 2012/0314165 | A1* | 12/2012 | Kishimoto | G02F 1/133514 349/110 |
| 2013/0214279 | A1* | 8/2013 | Nishimura | G02F 1/13338 257/59 |
| 2013/0221358 | A1* | 8/2013 | Morosawa | H01L 29/66742 257/59 |
| 2014/0078458 | A1* | 3/2014 | Fukushima | G02F 1/133305 349/158 |

FOREIGN PATENT DOCUMENTS

| | | |
|---|---|---|
| JP | 9-297209 A | 11/1997 |
| JP | 11-23832 A | 1/1999 |
| JP | 11-52351 A | 2/1999 |
| JP | 11-167015 A | 6/1999 |
| JP | 2008-203875 A | 9/2008 |
| JP | 2009-151039 A | 7/2009 |
| JP | 2009-151095 A | 7/2009 |
| JP | 2010-175918 A | 8/2010 |
| JP | 2010-271699 A | 12/2010 |
| JP | 2011-215316 A | 10/2011 |
| JP | 2012-133293 A | 7/2012 |

OTHER PUBLICATIONS

Korean Office Action dated Nov. 28, 2017 in Korean Patent Application No. 10-2015-7034974, 7 pages (with English translation).
Extended European Search Report dated Apr. 26, 2017 in Patent Application No. 14814419.9.
International Search Report dated Sep. 2, 2014 in PCT/JP2014/064603, filed Jun. 2, 2014.

* cited by examiner

DISPLAY REGION 3

DISPLAY DEVICE SUBSTRATE, DISPLAY DEVICE USING SAME

CROSS-REFERENCE TO RELATED APPLICATIONS

The present application is a continuation of International Application No. PCT/JP2014/064603, filed Jun. 2, 2014, which is based upon and claims the benefits of priority to Japanese Application No. JP 2013-126842, filed Jun. 17, 2013. The entire contents of these applications are incorporated herein by reference.

BACKGROUND OF THE INVENTION

Field of the Invention

The present invention relates to a display device substrate used for a liquid crystal display device or an organic EL display device, and a display device using the same.

Discussion of the Background

A liquid crystal display panel included in a general liquid crystal display device has a configuration in which the liquid crystal layer is sandwiched by two substrates. Each of the two substrates includes, for example, a transparent substrate such as glass. The polarizing plates or the polarizing plates and a phase difference plate are provided in the front side and the back side of the liquid crystal panel.

An organic electro luminescent display device (hereinafter referred to as an EL display device) is provided with an organic EL of white emitting instead of the liquid crystal. The organic EL display device includes a red filter, a green filter and a blue filter, whereby color display can be performed. The organic EL display device is used as high definition display device.

In these display devices, especially for use in a mobile device, high definitions have been enhanced to produce 300 ppi (pixel per inch), 400 ppi, 500 ppi and more.

Patent literature 1 (Japanese Patent Application Laid-Open Publication Number 1999-52351) discloses a technique in which a film thickness of the black matrix at a peripheral portion between the display region and the seal member and a film thickness of the color filter in the display region are approximately the same. Claim 3 of patent literature 1 discloses a technique in which the black matrix in the display region is formed as a single layer and the black matrix in the peripheral portion is formed as two layers.

According to paragraph [0030] of patent literature 1, film thicknesses of the first layer and the second layer are disclosed. Moreover, according to paragraph [0026] of patent literature 1, a technique is disclosed in which the black matrix of the first and second layers are formed with the same material. However, a composition of the black matrix in the examples is not disclosed. In paragraph [0015] of patent literature 1, it is not disclosed whether or not the black pigment is a carbon based pigment or another pigment such as graphite. Further, according to patent literature 1, an alignment method in a photolithography including exposure when using the same material for the black matrix of the first and second layers is not disclosed and also a forming method of the black matrix having high light shielding properties is not disclosed. Furthermore, according to patent literature 1, only a configuration in which the black matrix of the first and second layers are overlapped in the thickness direction is disclosed and a problem obtaining high definition pixels at more than 300 ppi for example is not disclosed.

In patent literature 2 (Japanese Patent Application Laid-Open Publication Number 1997-297209), a light shielding layer of two-layer configuration is disclosed. The two-layer configuration is constituted of a first light shielding layer 1 containing a black pigment and a photosensitive resin as the principal components and a second light shielding layer containing graphite as a principal component. According to paragraph [0012] of patent literature 2, as a black pigment, carbon black, titanium oxide, iron black, aniline black and the like are disclosed. According to a manufacturing method of patent literature 2, as disclosed in paragraph [0028] to paragraph [0035], a method is disclosed in which the first light shielding layer is exposed and then a second light shielding layer having thin film thickness (0.2 μm) is coated and exposed together with the first light shielding layer which is the under coating. However, according to patent literature 2, a problem of obtaining high definition pixels, at more than 300 ppi for example is not disclosed, and only a configuration in which the black matrix of the first and second layers are touching in the thickness direction is disclosed. The means for obtaining an optical density (for example, optical density 4 or more) necessary for the frame portion is also not disclosed.

In patent literature 1 and patent literature 2, alignment (positioning in manufacturing process) under a configuration in which the light shielding layer of the two-layer configuration have different patterns, or the two layer light shielding layers do not touch on its boundary surface is not disclosed.

PTL 1: Japanese Patent Application Laid-Open Publication Number 1999-52351
PTL 2: Japanese Patent Application Laid-Open Publication Number 1997-297209

SUMMARY OF THE INVENTION

According to one aspect of the present invention, a display device substrate includes a transparent substrate, a frame member disposed on the transparent substrate and formed in a frame region surrounding a display region, a first transparent resin layer formed on the transparent substrate having the frame member formed thereon, a black matrix formed on the first transparent resin layer such that the display region is divided into plural openings in a matrix form, and a second transparent resin layer formed on the first transparent resin layer on which the black matrix is formed. The frame member includes carbon as a major colorant and has a light shielding property, and the black matrix includes at least one organic pigment as a major colorant.

According to another aspect of the present invention, a display device includes a display device substrate having a display region and a frame region surrounding the display region, a liquid crystal layer, an array substrate that faces the display device via the liquid crystal layer, the array substrate including metal wirings and active elements. The active elements include a liquid crystal drive element and a light receiving element, and the metal wirings comprise a metal on a surface thereof, which reflects a light having a wavelength in a sensitivity region of the light receiving element. The display device substrate includes a transparent substrate, a color filter formed on the transparent substrate and including a red filter, a green filter and a blue filter, a first transparent resin layer formed on the color filter, a black matrix formed on the first transparent resin layer such that the display region is divided into plural openings in a matrix form, the black matrix including at least one organic pigment as a major colorant, a second transparent resin layer formed on the first transparent resin layer on which the black matrix is formed, and a backlight unit disposed near a back surface of the array substrate which is opposite to a side where the liquid crystal layer is formed. The backlight unit emits a visible light and a light having a wavelength in the sensitivity region of the light receiving element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
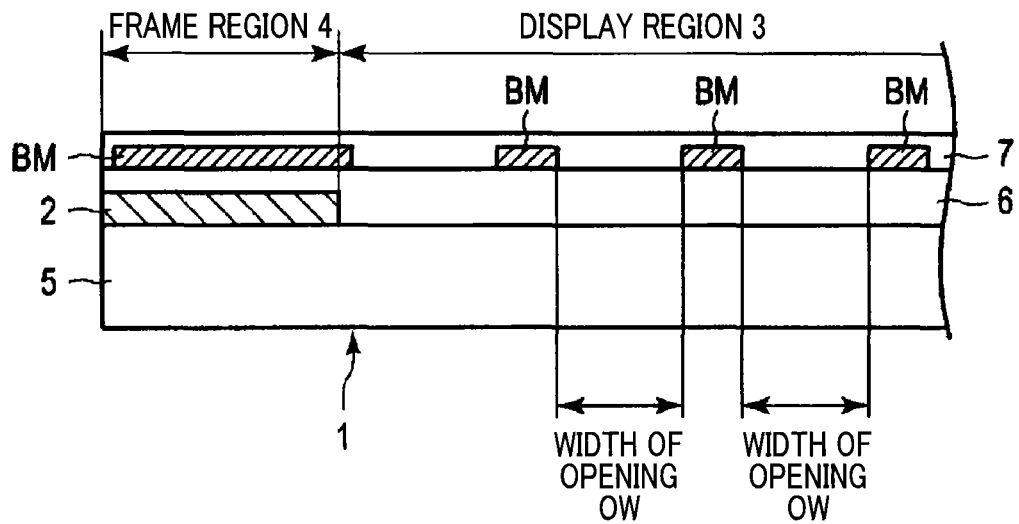
FIG. 1 is a cross sectional view partly showing an example of a display device substrate according to the first embodiment.

The embodiments will now be described with reference to the accompanying drawings, wherein like reference numerals designate corresponding or identical elements throughout the various drawings.

With reference to the drawings, embodiments of the present invention are described as follows. In the following description, the same reference numbers are added to identical or substantially identical functions and elements and the explanation thereof will be omitted or will be explained as needed.

In the respective embodiments, only characteristic parts are described and description of parts which are not different from the elements of a regular liquid crystal display device is omitted.

In the respective embodiments, a case in which the display unit of the liquid crystal display device has one pixel is described. However, the display unit may be one sub pixel or a plurality of pixels may constitute a display unit or arbitrarily defined pixel may constitute a display unit. The pixels are divided by the black matrix and the pixel is a minimum unit being polygon having at least two parallel sides. In the respective embodiments, the pixel and the opening have almost the same meaning.

In planar view, the horizontal direction of the pixel is parallel to a direction along which the right eye and the left eye of the observer are located.

In planar view, a direction perpendicular to the horizontal direction of the pixel is defined as a vertical direction of the pixel.

In the respective embodiments, the display device substrate included in the display device may use a time division light emission drive method for an organic EL that emits red, green and green light or a LED light emitting element that emits red, green and blue light. When using the time division light emission drive method for the display device, the display device substrate may use a configuration in which a color filter (described later) is omitted.

When a LED back light unit having a white organic EL or red, green and blue peak light emission is used as a light source, the display device substrate may include a color filter in which a red filter (red layer pattern), a green filter (green layer pattern) and a blue pattern (blue layer pattern) are arranged next to each other as pixels.

In the respective embodiments, various liquid crystal alignment methods or liquid crystal drive methods may be employed. For example, liquid crystal alignment methods or liquid crystal drive methods such as IPS (In Plane Switching: horizontal electric field method using liquid crystal molecules having horizontal alignment), VA (Vertically Alignment: vertical electric field method using liquid crystal molecules having vertical alignment), HAN (Hybrid-aligned Nematic), TN (Twisted Nematic), OCB (Optically Compensated Bend), CPA (Continuous Pinwheel Alignment), ECB (Electrically Controlled Birefringence), or TBA (Transverse Bent Alignment) are used. The liquid crystal layer may include liquid crystal molecules having positive dielectric anisotropy or negative dielectric anisotropy.

A rotational direction (operational direction) of liquid crystal molecules when a liquid crystal drive voltage is applied may be a direction parallel to the surface of the substrate or may be a standing direction perpendicular to the surface of the substrate. The direction of the liquid crystal drive voltage applied to the liquid crystal molecules may be the horizontal direction, or a two-dimensional/three-dimensional oblique direction or the vertical direction.

As an input method for display device according to the respective embodiments, for example, an on-cell method in which a touch panel having a sensing function is disposed at a front surface of the liquid crystal panel to allow an input operation by the touch panel, or an in-cell method in which a touch sensor is included inside the display device can be employed. As the in-cell method, a method in which sensors are arranged in a matrix on the array substrate of the display device or the display device substrate, or a method in which electrodes for sensing operation are disposed on the display device substrate may be employed. As a sensing means, a method using electromagnetic waves including infrared ray or visible light or a method using electrostatic capacitance for sensing may be used. In the respective display devices, any one of these sensing means (sensing device) can be employed.

In the display device according to the respective embodiments, an in-cell method in which an optical sensor is integrated to the liquid crystal panel can be used. A detection accuracy of the liquid crystal display device that integrates the optical sensor is likely to be influenced by temperature and the backlight light source. To avoid incorrect input operation when using a finger or laser, which is caused by noise due to back light or light from outside, the optical sensor may need to be compensated. As the optical sensor, when a silicon photo diode provided with a channel layer formed by poly silicon or amorphous silicon is used, dark current occurs due to a change in ambient temperature so that noise which is not measurement light may be added to the measurement data.

As a semiconductor used for the optical sensor, there is a composite metal oxide semiconductor that represents an amorphous silicon semiconductor having sensitivity to visible light region (e.g., light wavelength approximately from 400 nm to 700 nm) and an infrared region, a poly crystalline silicon semiconductor having major sensitivity to a near ultraviolet region or blue wavelength region, a micro crystalline silicon semiconductor, a silicon germanium (Si Ge) semiconductor, IGZO (registered trade mark) or ITZO (registered trade mark). When using these semiconductors, preferably, the bandgap of the semiconductor is adjusted so as to set a sensitivity region of the optical sensor in a desired wavelength region. With the SiGe semiconductor, the bandgap can be continuously changed with an addition ratio of Ge so that the wavelength of received light of the light receiving element can be adjusted, whereby absorption properties in the infrared region can be obtained. SiGe semiconductors having a concentration gradient of Ge may be used.

As a transistor used for switching an optical sensor (switching element), a transistor (TFT) using a composite metal oxide semiconductor such as IGZO or ITZO may be used. For the transistor wiring, a metal wiring of a laminate configuration having two or more layers are employed. The two or more layers include aluminum, copper and titanium which have low resistance or alloys containing these materials, and metals having high melting points such as molybdenum, titanium or titanium alloys. For example, the composite metal oxide semiconductor transistor is defined as a transistor provided with a transparent channel layer containing two or more metal oxides from among indium, gallium, tin, zinc, hafnium, yttrium and germanium.

As for a transistor in which a transparent channel layer is formed with a composite metal oxide semiconductor, a photo transistor may preferably be used in which dopant is introduced into the transparent channel layer so as to lower the bandgap, thereby having sensitivity to a desired sensitivity region (light wavelength). In the photo sensor, the sensitivity may preferably be applied to a wavelength region from visible light region to an infrared region by lowering the band gap of the composite metal oxide semiconductor, poly crystalline silicon and micro crystalline silicon semiconductor. For example, by using a composite metal oxide semiconductor transistor, a TFT for driving the liquid crystal and a photo transistor having sensitivity to the visible light region or the near infrared region can be formed within the same layer in the same process. Hence, significant cost reduction can be achieved.

As a dopant capable of being applied to adjust the band gap, various elements such as phosphorus, antimony, arsenic, boron, aluminum, indium, titanium, zinc, gallium, tin, fluorine, chlorine, hydrogen or the like can be selected. For introducing the dopant, ion implantation, ion doping or plasma immersion-ion implantation can be used.

For example, by using GaAs, InGaAs, PbS, PbSe, SiGe and SiGeC, an optical sensor suitable for absorbing infrared light can be formed.

When using a black matrix containing an organic pigment as a major colorant, the wavelength can be set corresponding to the infrared light of near infrared region that permeates therethrough so that a preferred color separation technique can be provided with a combination of the color filter and the black matrix. It should be noted that the major colorant is a colorant having mass solid ratio 50% or more with respect to the total amount of the colorant which is dispersed or added. The black matrix principally allows the near infrared light to permeate. Therefore, in the respective embodiments, a metal wiring of which the base material is copper, having a reflectance in near infrared light which is higher than that of aluminum is suitable for the wiring of the active element paired with the display device substrate. The reason for this will be described in the following embodiments in detail.

In the respective embodiments, an example will be described in which the embodiments of the present invention are applied to a liquid crystal display device. However, the embodiments of the present invention may be applied to other display devices such as organic EL display device.

First Embodiment

FIG. 1 is a cross sectional view partly showing an example of a display device substrate according to the present embodiment. FIG. 1 shows an edge portion including a frame portion 2 of a display device substrate 1.

Figure 2:
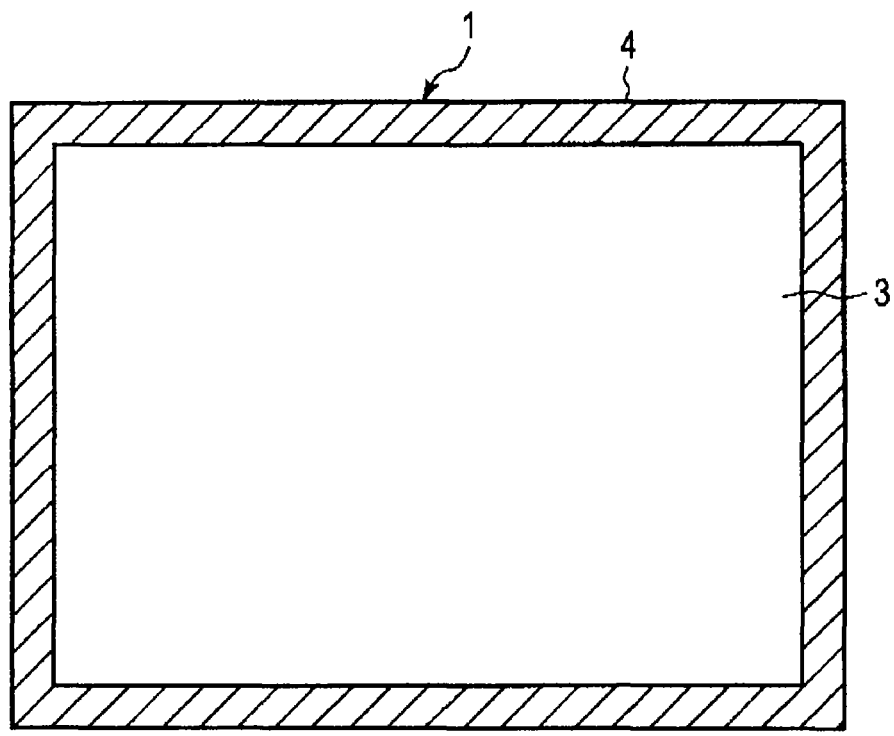
FIG. 2 is a planar view showing an example of a display device substrate according to the first embodiment.

FIG. 2 is a planar view showing an example of the display device substrate 1 according to the present embodiment. FIG. 2 shows a display region 3 and a frame region 4 provided in a periphery of a display region 3, in planar view.

Figure 3:
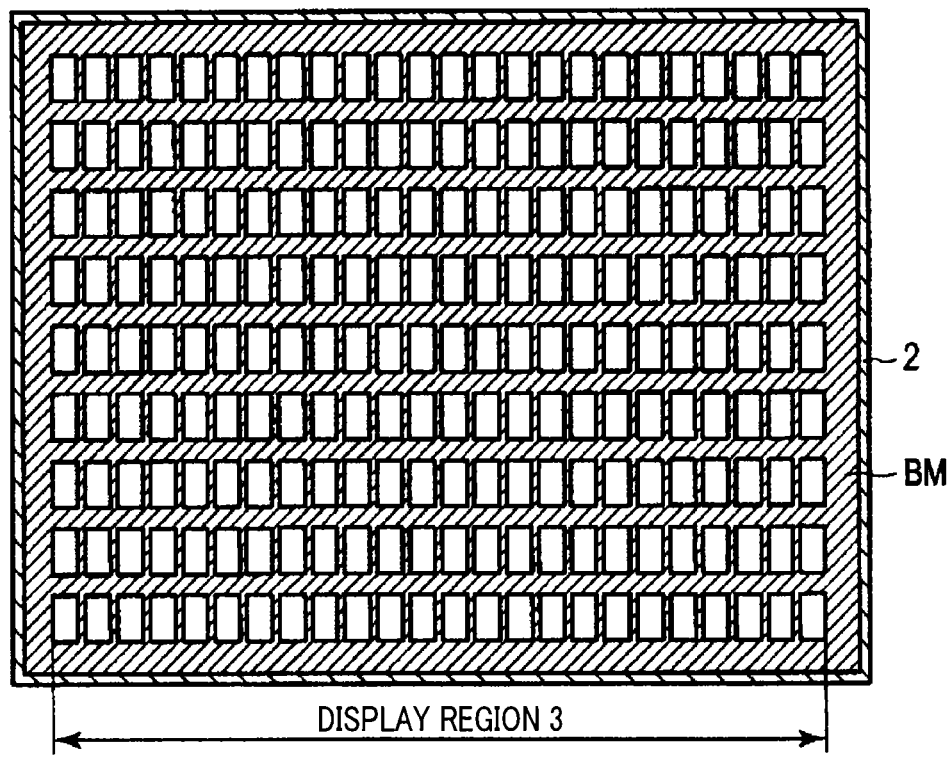
FIG. 3 is a planar view showing an example of a laminating relation between a frame portion and a black matrix of a display device substrate according to the first embodiment.

FIG. 3 is a planar view showing an example of a laminate relation between the frame portion 2 of the display device substrate 1 according to the present embodiment and a black matrix BM.

For the display device substrate 1, the black matrix BM containing an organic pigment is formed an appropriate distance away from the frame region 2 containing carbon pigment via the first transparent resin layer 6. As described later, when in the manufacturing phase, for example, alignment using an infrared light is performed.

The display device substrate 1 is provided with a transparent substrate 5, a frame portion 2, a first transparent resin layer 6, a black matrix BM and a second transparent resin layer 7.

For example, the transparent substrate 5 may be a transparent substrate such as glass. The display device substrate 1 as shown in FIG. 2 and FIG. 3 is a schematic diagram illustrating a screen of a single display device. In the manufacturing process, several dozens of pieces are surface-mounted on a large-sized transparent substrate. According to the present embodiment, one pair (e.g., 2 pcs) or more pairs of alignment marks are first formed on the large-sized transparent substrate. For example, these alignment marks are formed on the edge portion of the large-sized glass substrate together with the frame portion 2, using a photo sensitive resin having light shielding properties which is used for the frame portion 2. This manufacturing method is described later.

The frame portion 2 is formed on a first plane of the transparent substrate 5 at a cross section and in the frame region 4 having a frame shape surrounding the display region 3 in planar view. The frame region 2 contains a carbon pigment as a major colorant.

The first transparent resin layer 6 is formed on the transparent substrate 5 where the frame portion 2 is formed.

The black matrix BM is formed on the first transparent resin layer 6. The black matrix BM contains an organic pigment as a major colorant. The black matrix BM includes a portion that substantially overlaps with the frame portion 2 and a portion formed at a boundary portion of the pixels. According to the present embodiment, the black matrix BM may be formed slightly inside (a region where the display region 3 is formed) the frame portion 2. The black matrix BM divides the display region 3 into a plurality of openings having a matrix shape.

The second transparent resin layer 7 is formed on the first transparent resin layer 6 where the black matrix BM is formed.

It should be noted that a transparent electrode such as ITO (Indium-Tin-Oxide, transparent conductive film) or an alignment film for the liquid crystal may be formed on the second transparent resin layer 7.

The display device substrate 1 may be provided with a transparent electrode for touch sensing and a metal wiring as needed. The respective film thicknesses of the first transparent resin layer 6 and the second transparent resin layer 7 can be appropriately selected from a range, for example, approximately from 0.3 µm to 4 µm.

A shape when viewing in planar view of the frame portion, i.e., frame region 4, is nearly a rectangle as shown in FIG. 2. The black matrix BM formed on the frame portion 2 via the first transparent resin layer 6 is formed as a matrix-shaped pattern that divides a plurality of pixels (width OW of the opening portion) as shown in FIG. 3. As described, in the present embodiment, the frame portion 2 and the black matrix BM are formed with mutually different patterns and mutually different colorants. The respective film thicknesses of the frame portion 2 and the black matrix BM are not necessarily determined, however, the thickness can be selected, for example, from a range approximately 0.8 µm to 2 µm.

Therefore, the black matrix BM according to the present embodiment is formed more closely to a functional block serving as a light emission or a light-pass-through of the display device. The black matrix formed more closely to the functional block serving as a light emission or a light-pass through in the display device, for example, in the high definition display device having 300 ppi resolution or more, avoids light emission or light-pass-through (light leakage) occurring at a functional block located at a vicinity of a region between mutually adjacent pixels, so as to maintain high contrast. However, the display device substrate 1 according to the present embodiment may be applied to a display device having approximately less than 330 ppi resolution. The shape of pixel and the number of pixels of the pixel as shown in FIG. 3 is exemplified schematically for explanatory convenience reasons, and the present invention is not limited to the above-described embodiment. The pixel shape may be a V-shape (doglegged shape) or other polygonal shapes.

Figure 4:
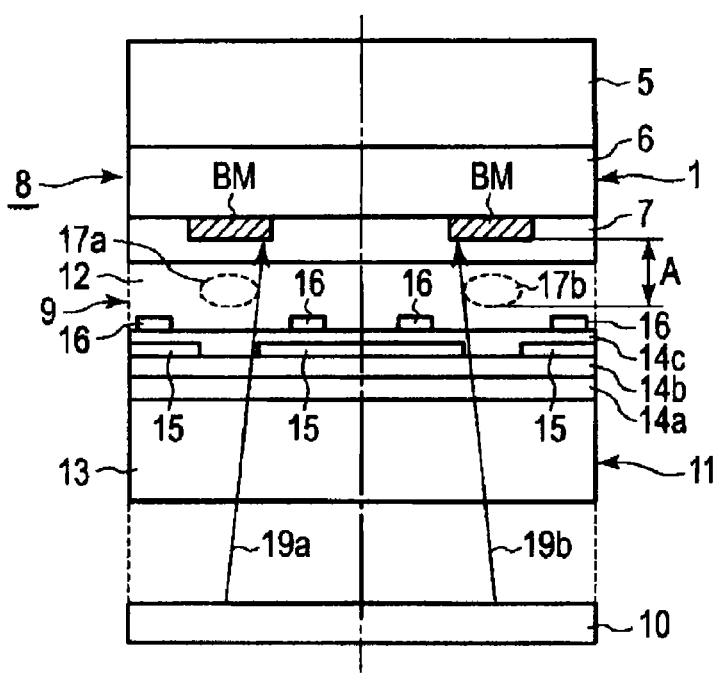
FIG. 4 is a cross sectional view partly showing a configuration of a liquid crystal display device provided with a display device substrate according to the first embodiment.

FIG. 4 is a cross sectional view partly showing a configuration of a liquid crystal display device 8 provided with a display device substrate 1 according to the first embodiment.

The liquid crystal display device 8 is provided with a liquid crystal panel 9 and a backlight unit 10. The liquid crystal panel 9 is provided with an array substrate 11, a liquid crystal layer 12 and a display device substrate 1. The array substrate 11 and the display substrate 1 face each other via the liquid crystal layer 12.

The transparent substrate 5 of the display device substrate 1 faces an observer and the second transparent resin layer 7 faces the liquid crystal layer 12.

The array substrate 11 is provided with a transparent substrate 13 and insulation layers (transparent resin) 14a to 14c, a common electrode 15 and a pixel electrode 16.

As a transparent substrate 13, for example, a glass plate is used.

The insulation layer 14a is formed on a first plane of the transparent substrate 13. The insulation layer 14b is formed on the insulation layer 14a.

A plate-shaped common electrode 15 is formed on the insulation layer 14b. The insulation layer 14c is formed on the insulation layer 14b where the common electrode 15 is formed. A pixel electrode 16 is formed on the insulation layer 14c.

The pixel electrode 16 is formed, for example, in a comb-like shape in planar view. The pixel electrode 16 may be formed in a stripe pattern having a longitudinal direction perpendicular to a cross section of FIG. 4.

In the array substrate 11 as shown in FIG. 4, an active element such as thin film transistor (TFT) is provided as well.

The pixel electrode 16 of the array substrate 11 faces the liquid crystal layer 12. The second plane of the transparent substrate 13 of the array substrate 11 is inside the liquid crystal display device 8. In other words, the second plane faces the back light unit 10.

The liquid crystal layer 12 may include liquid crystal molecules having negative dielectric anisotropy or liquid crystal molecules having positive dielectric anisotropy.

For example, in the liquid crystal display device 8, a functional block serving a light emission or a light-pass-through is the liquid crystal layer 12. In the liquid crystal display device 8, misaligned regions 17a and 17b of liquid crystal can exist between mutually adjacent pixels in which sufficient alignment control cannot be performed. Sufficient liquid crystal drive voltage is not applied to the liquid crystal molecules in the misaligned regions 17a and 17b. In the alignment false regions 17a and 17b, since the direction where the liquid crystal drive voltage is applied differs from the openings, a liquid crystal driving cannot be performed effectively. In addition, the alignment false regions 17a and 17b is a portion where a cross-talk from adjacent pixels is most likely to occur, which is likely to cause a mixed color due to light leakage occurring at adjacent pixels.

Figure 5:
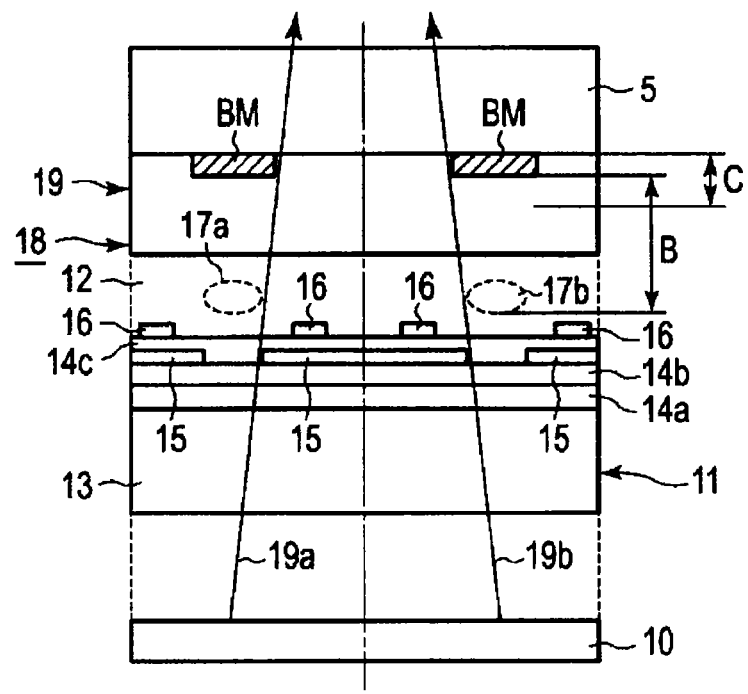
FIG. 5 is a cross sectional view partly showing a configuration of a conventional liquid crystal display device.

FIG. 5, which is used for showing a comparison with respect to FIG. 4, is a cross sectional view partly showing a configuration of a conventional liquid crystal display device 18. In the conventional liquid crystal display device 18, usually, the black matrix BM is formed on the transparent substrate 5 with the same material and method as the frame portion 2. In the conventional liquid crystal display device 18, since the black matrix BM exists in a region (position) which is away from the misaligned regions 17a and 17b by a distance B, oblique light 19a and 19b passes through the misaligned regions 17a and 17b and is likely to be emitted as light leakage. The oblique light 19a and 19b adversely affects the contrast and gradation expression of display as the liquid crystal display device has a higher definition resolution. When the conventional display device substrate 19 is used as a color filter substrate, as shown in FIG. 5, at a color filter location C, a red filter, a blue filter and a green filter are formed.

However, in the display device substrate 1 as shown in the above-described FIG. 4, the black matrix BM is formed closer to the liquid crystal layer 12. Therefore, the oblique light 19a and 19b is cut off by the black matrix BM, whereby emission of the oblique light 19a and 19b is suppressed. The display device substrate 1 according to the present embodiment avoids light emission or light-pass-through (light leakage) in the display device 8 having high definition pixels, which occurs at a functional block in the vicinity of a region between adjacent pixels, thereby maintaining high contrast.

The frame portion 2 is formed by dispersing carbon pigment into a resin as a light shielding colorant. The frame portion 2 may be formed to have a large film thickness because the frame portion 2 is not used for forming thin lines like the black matrix BM with respect to a region having a large area in the display region 3.

For example, the frame portion 2 may be formed to include a rough pattern that surrounds four sides of the display region 3 and alignment marks (not shown) at a few locations and to have an optical density of 4 or more in the film thickness direction or preferably 5 or more.

Figure 6:
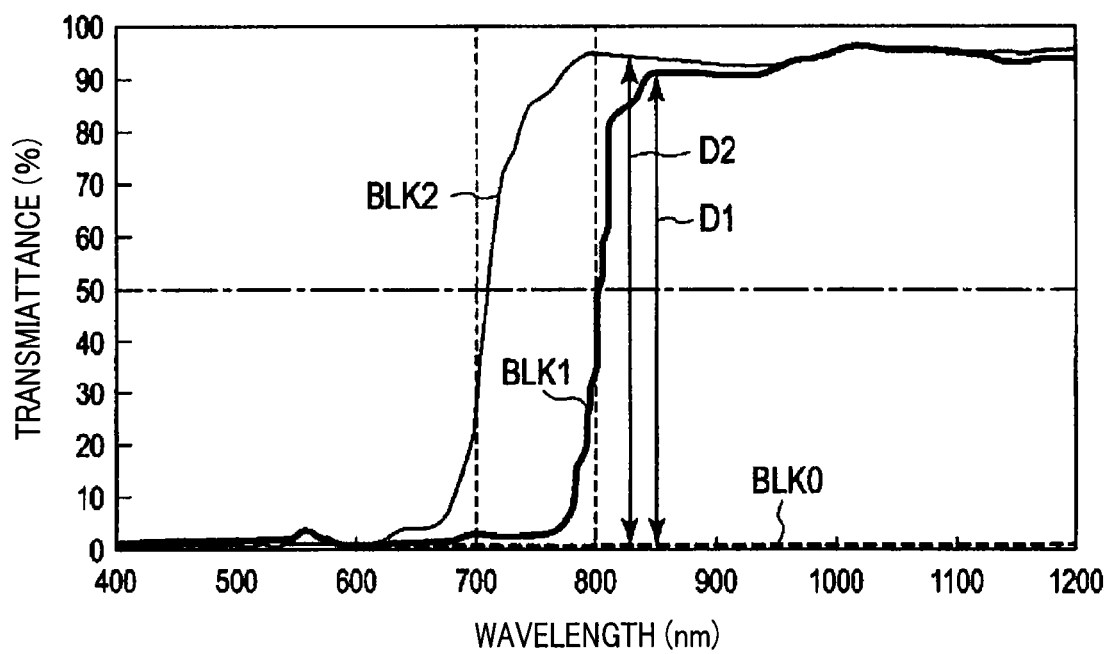
FIG. 6 is a graph showing an example of transmittance characteristics BLK0 of the frame portion and transmittance characteristics BLK1 and BLK2 of typical black matrix.

FIG. 6 is a graph showing an example of transmittance characteristics (spectral characteristics) BLK0 of the frame portion 2 and transmittance characteristics BLK1 and BLK2 of a typical black matrix BM.

The transmittance characteristics BLK0 show transmittance at a frame portion that contains carbon pigment as a major colorant.

The transmittance characteristics BLK1 and BLK2 represent a transmittance of a black matrix BM containing an organic pigment as a major colorant. A half value wavelength (wavelength at which the transmittance becomes 50%) of these transmittance characteristics BLK1 and BLK2 is adjusted to be within a wavelength range from approximately 680 nm to 800 nm by combining organic pigments.

At a wavelength region longer than the half value wavelength of the transmittance characteristics BLK1, a transmittance difference D1 between the transmittance characteristics BLK1 and the transmittance characteristics BLK0 becomes larger. The transmittance difference D1 is around 850 nm difference.

At a wavelength region longer than the half value wavelength of the transmittance characteristics BLK2, a transmittance difference D2 between the transmittance characteristics BLK2 and the transmittance characteristics BLK0 becomes large.

As a method for forming the frame region 2 and the black matrix BM, for example, a well-known photolithography method can be used. For alignment in the photolithography process, for example, an infrared light and an infrared sensor are used to perform the alignment. The infrared light has a wavelength of approximately 850 nm which is in a long wavelength region that is longer than the half value wavelength of the transmittance characteristics BLK1 or the transmittance characteristics BLK2. The infrared sensor is capable of detecting alignment marks formed with the material same as the frame portion 1.

The liquid crystal display devices 8 and 18 as shown in FIG. 4 and FIG. 5 employ a liquid crystal alignment method of an initial horizontal alignment which is referred to as IPS and drives liquid crystal molecules using the liquid crystal drive voltage applied to the pixel electrode 16 and the common electrode 15 provided closely to the array substrate 11. The pixel electrode 16 is a comb-like shaped electrode having a longitudinal direction perpendicular to the paper surface. The pixel electrode 16 and the common electrode 15 are formed by processing a transparent conductive film such as ITO. In FIG. 4 and FIG. 5, TFT (for example, a transistor having composite metal oxide semiconductor as a channel layer), polarizing plates and a phase difference film and an alignment film which aligns liquid crystal molecules to be in the horizontal direction which are included in the array substrate 11 are omitted.

The backlight unit 10 as shown in FIG. 4 may include a solid light emitting element (LED) adapted for red, green and blue light emission.

The backlight unit 10 operates, for example, based on synchronous control of time division (field sequential) light emission for a red LED, a green LED and a blue LED, and a liquid crystal drive corresponding to the pixel portion. Thus, the liquid crystal display device 8 is able to perform full-color display. Further, touch sensing may be accomplished in which an infrared light emission LED is used in addition to the red LED, the green LED and the blue LED and infrared light emitted from the infrared light LED is irradiated to a pointer such as a finger to observe the reflected light from the pointer.

According to the present embodiment as described above, since the black matrix BM is formed more closely to the liquid crystal layer 12, for example, light leakage such as oblique light 19a and 19b that penetrate the vicinity of a region between mutually adjacent pixels can be cut off by the black matrix BM. Hence, light leakage is avoided from emitting from the liquid crystal display device.

Second Embodiment

The present embodiment is a modification of the above-described first embodiment.

Figure 7:
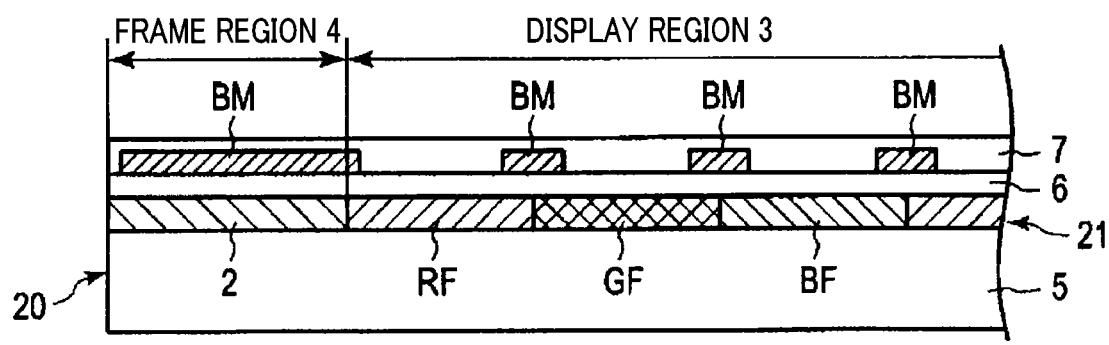
FIG. 7 is a cross sectional view partly showing an example of a display device substrate according to the second embodiment.

FIG. 7 is a cross sectional view partly showing an example of a display device substrate according to the present embodiment. FIG. 7 shows an edge portion including the frame portion 2 of the display device substrate 20.

The display device substrate 20 includes a transparent substrate 5, a frame portion 2 and a color filter 21, a first transparent resin layer 6, a black matrix BM and a second transparent resin layer 7. The color filter 21 includes red filters RF, green filters GF and blue filters BF.

The frame portion 2 is provided on a first plane of the transparent substrate 5 along with a color filter in which red filters RF, green filters GF and blue filters BF are arranged to be adjacent.

The first transparent resin layer 6 is formed on the frame portion 2 and the color filter 21.

The black matrix BM is formed on the first transparent resin layer 6.

The second transparent resin layer 7 is formed on the first transparent resin layer 6 where the black matrix BM is formed.

The film thickness of the color filter 21 is not necessarily determined, but, however, can be selected from a range approximately from 0.5 μm to 3 μm. The film thicknesses of the frame portion 2 and the color filer 21 may be the same or not the same.

Figure 8:
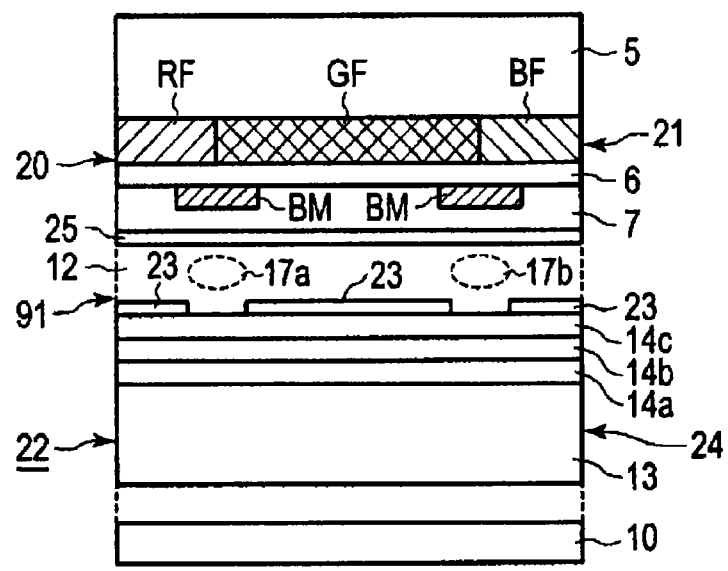
FIG. 8 is a cross sectional view partly showing a configuration of a liquid crystal display device provided with a display device substrate according to the second embodiment.

FIG. 8 is a cross sectional view partly showing a configuration of a liquid crystal display device 22 provided with a display device substrate 20 according to the present embodiment.

The liquid crystal display device 22 is provided with a liquid crystal panel 91 and a back light unit 10. The liquid crystal panel 91 is provided with an array substrate 24, a liquid crystal layer 12 and a display device 20. The array substrate 24 and the display device substrate 20 face each other via the liquid crystal layer 12.

In the display device substrate 20, a conductive oxide layer such as ITO is formed as a common electrode 25 on the second transparent resin layer 7. An alignment film may be formed on the common electrode 25, which is omitted in FIG. 8. The transparent substrate 5 of the display device substrate 20 faces the observer and the common electrode 25 faces the liquid crystal layer 12.

The array substrate 24 includes insulation layers 14a to 14c and pixel electrodes 23 provided for every pixel, on the first plane of the transparent substrate 13. An alignment film may be formed on the pixel electrode 23, which is omitted in FIG. 8. Further, in FIG. 8, TFT (for example, a transistor having a composite metal oxide semiconductor as a channel layer), polarizing plates and a phase difference film are omitted.

The pixel electrode 23 of the array substrate 24 faces the liquid crystal layer 12. The second plane of the transparent substrate 13 of the array substrate 24 is located inside the liquid crystal display device 22. In other words, the second plane of the transparent substrate 13 faces the back light unit 10.

According to the present embodiment, the liquid crystal layer 12 includes liquid crystal molecules having an initial vertical alignment.

The liquid crystal molecules are driven when the liquid crystal drive voltage is applied between the pixel electrode 23 and the common electrode 25. By applying the liquid crystal drive voltage, for example, the long axis of the liquid crystal molecules is tilted toward a direction substantially horizontal with respect to the substrate surface.

In the present embodiment, misaligned regions 17a and 17b exist. However, according to the present embodiment, since the black matrix BM is provided close to the liquid crystal layer 12, the light emission of the oblique light that permeates the misaligned regions 17a and 17b is suppressed in order that the display quality is prevented from degrading.

Figure 9:
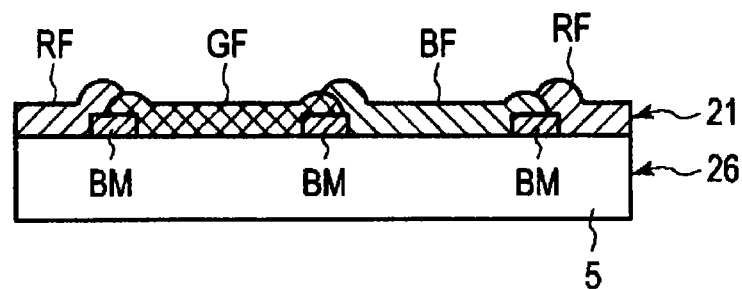
FIG. 9 is a cross sectional view showing an example of a well-known typical color substrate.

Here, in FIG. 9, a cross sectional view showing an example of a well-known typical color filter substrate 26 is shown. The well-known color filter substrate 26 has a laminate structure including a transparent substrate 5, a black matrix BM containing colorant such as carbon pigment, and a color filter 21. According to the color filter substrate 26, a protrusion at an overlap formed among the red filter RF, the green filter GF and the blue filter BF occurs and may cause a decrease of the alignment accuracy of the liquid crystal molecules.

However, in the display device substrate 20 according to the present embodiment, a black matrix BM is not formed between adjacent filters, i.e., a red filter RF, a green filter GF and a blue filter BF. Therefore, a protrusion due to an overlap formed among the black matrix BM, the red filter RF, the green filter GF and a blue filter BF does not occur.

Also, the black matrix BM containing a carbon pigment as a major colorant has an extremely high relative dielectric constant which is within a range approximately from 10 to 20 and is difficult to dispose near the liquid crystal layer 12. When a component having high relative dielectric constant is located near the liquid crystal layer 12, a voltage distribution spread from the pixel electrode 23 is distorted, and thereby the liquid crystal display may be adversely influenced. According to the present embodiment, the relative dielectric constant of the black matrix BM containing organic pigments as a major colorant has a small value which ranges approximately 3.5 to 4.5. Therefore, the influence on the liquid crystal display can be very small.

Third Embodiment

The present embodiment is a modification of the above-described first embodiment.

Figure 10:
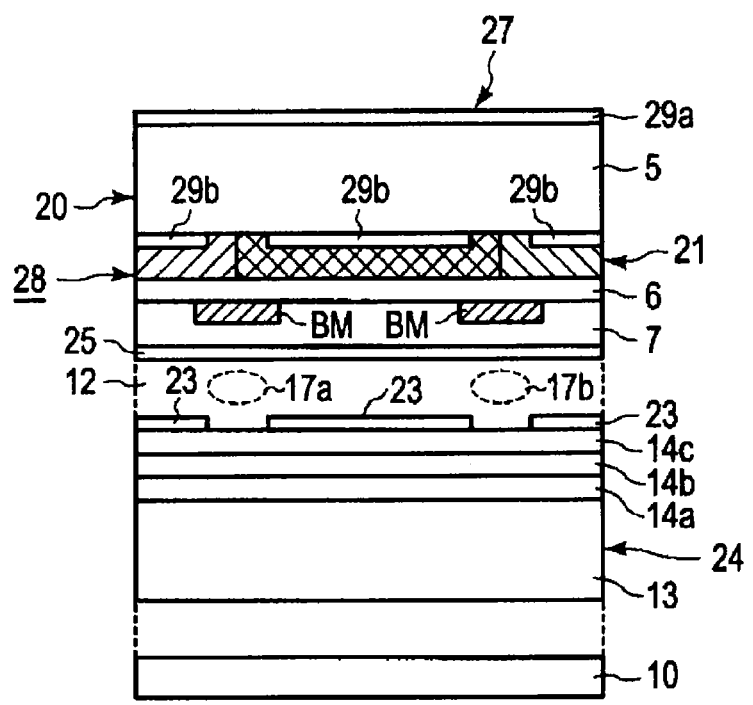
FIG. 10 is a cross sectional view partly showing a configuration of a liquid crystal display device provided with a display device substrate according to the third embodiment.

FIG. 10 is a cross sectional view partly showing a configuration of a liquid crystal display device 28 provided with a display device substrate 27 according to the present embodiment.

The liquid crystal display device 28 further includes a first sensing electrode 29a and a second sensing electrode 29b on the display device substrate 20 as shown in the above-described FIG. 8.

The first sensing electrode 29a is provided at the second plane of the transparent substrate 5. That is, the first sensing electrode 29a is located closer to the observer.

The second sensing electrode 29b is provided on the first plane of the transparent substrate 5. That is, the second sensing electrode 29b is provided on the color filter 21 (between the transparent substrate 5 and the color filter 21).

In the present embodiment, first, the first and the second sensing electrodes 29a and 29b are formed on the transparent substrate 5. The color filter 21 and the frame portion 2, the first transparent resin layer 6, the black matrix BM, the second transparent resin layer 7 and the common electrode 25 are formed on the second sensing electrode 29b.

The first sensing electrode 29a is constituted of, for example, a plurality of parallel electrodes extending in the first direction, in planar view.

For example, the second sensing electrode 29b is constituted of a plurality of parallel electrodes extending in the second direction which crosses the first direction at a right angle, in planar view.

For example, the first and the second sensing electrodes 29a and 29b may be in stripe patterns where the respective sensing electrodes 29a and 29b cross each other, in planar view.

The first and second sensing electrodes 29a and 29b may be a pattern in which a plurality of rhombuses are coupled in planar view.

The design specification such as pitches and resistance of the respective patterns in the first and second sensing electrodes can be appropriately changed based on purpose of use.

Either the first sensing electrode 29a or the second sensing electrode 29b may be provided closely to the array substrate 24. Either the first sensing electrode 29a or the second sensing electrode 29b is provided close to the array substrate 24, whereby a switching element used for touch sensing can be formed on the array substrate 24 by a transistor (TFT) to be utilized.

For example, the first sensing electrode 29a may be formed at higher location (location closer to the liquid crystal layer 12) than the second sensing electrode 29b via the insulation layer.

Although the configuration as shown in FIG. 10 is employed, misaligned regions 17a and 17b exist. However, in the present embodiment, since the black matrix BM is disposed at a location close to the liquid crystal layer 12, the light emission of the oblique light that permeate the misaligned regions 17a and 17b can be avoided. Hence, degrading of the display quality can be prevented.

Fourth Embodiment

The present embodiment is a modification of the above-described second embodiment. However, from a similar point of view, the above-described third embodiment may be modified.

Figure 11:
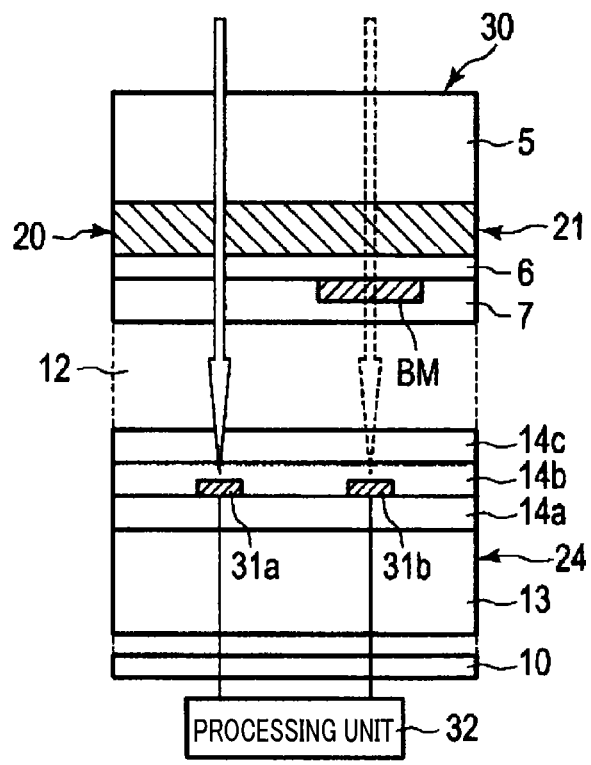
FIG. 11 is a cross sectional view showing an example of a part of liquid crystal display device according to the fourth embodiment.

FIG. 11 is a cross sectional view showing an example of a part of liquid crystal display device 30 according to the fourth embodiment.

In the present embodiment, the array substrate 24 is provided with a first optical sensor 31a and a second optical sensor 31b between the insulation layer 14a and the insulation layer 14b.

The first optical sensor 31a receives incoming light from the observer side via the color filter 21.

The second optical sensor 31b is formed, in planar view, at a location where the color filter 21 and the black matrix BM are overlapped. Hence, the second optical sensor 31b receives incoming light from the observer side via the color filter 21 and the black matrix BM.

For example, a processing unit 32 subtracts light reception data of the second optical sensor 31b from light reception data of the first optical sensor 31a. Thus, a high-precision observation result of the optical sensor can be obtained.

For example, the first optical sensor 31a and the second optical sensor 31b are formed with a photo transistor or a photo diode with respect to the array substrate 24. The first optical sensor 31a and the second optical sensor 31b are formed by using a silicon-based semiconductor and a switching element that controls the first optical sensor 31a and the second optical sensor 31b are formed with a composite metal oxide semiconductor. As a silicon-based semiconductor, amorphous silicon, low-temperature poly silicon, microcrystalline silicon and poly crystalline silicon may be employed.

The first optical sensor 31a and the second optical sensor 31b formed by the photo transistor or the photo diode as shown in FIG. 11 may preferably be formed with a semiconductor which is the same as the semiconductor used for the liquid crystal drive transistor (TFT) and with the same manufacturing process thereof.

The first optical sensor 31a and the second optical sensor 31b are photo diodes made of silicon semiconductor. When the liquid crystal drive transistor is formed with a silicon semiconductor, a transistor serving as a switching element of the photo diode may be simultaneously formed in the same layer as the photo diode.

The first optical sensor 31a and the second optical sensor 31b are photo transistors made of composite metal oxide semiconductor. When the liquid crystal drive transistor is formed with the composite metal oxide semiconductor, a photo transistor, a transistor serving as a switching element of the photo transistor may be simultaneously formed in the same layer.

For example, in case where the first optical sensor 31a and the second optical sensor 31b are photo diodes made of silicon semiconductor, the liquid crystal display device 30 is provided with a liquid crystal drive transistor and a switching element that controls the first optical sensor 31a and the second optical sensor 31b is constituted of a transistor, the liquid crystal drive transistor and the switching element may be formed in advance and a photo diode made of silicon semiconductor may be formed via the insulation layer. Thus, when the semiconductor used for the first optical sensor 31a and the second optical sensor 31b and the semiconductor used for the transistor serving as a transistor are different, the first optical sensor 31a, the second optical sensor 31b and the transistor can be formed in different layers.

In the above-described transistor formation, when forming a metal wiring of the first layer such as a gate electrode, in planar view, a pattern of a light-reflective coating may be formed in advance with a metal film the same as the metal wiring on an under coating of a portion where the photo diodes are arranged. This reflective coating pattern re-reflects incoming light to the first optical sensor 31a and the second optical sensor 31b (i.e., reception-light surface side) so that the sensitivity of the optical sensor can be enhanced.

When the object light of the touch sensing is infrared light, a reflective coating pattern may preferably be used. The reflective coating pattern uses, as a surface layer, copper having high reflectance in the infrared region. These reflective coating patterns are located under the first optical sensor 31a and the second optical sensor 31b. In the liquid crystal display device 30, these reflective coating patterns has a light shielding function for light emitted from the backlight unit 10.

The present embodiment exemplifies a case where liquid crystal having horizontal alignment referred to as IPS, is used.

For example, the first optical sensor 31a and the optical sensor 31b may be formed such that a pair of sensors for every one pixel, a pair of sensors for every three pixels or a pair of sensors for every six pixels is provided.

In order to perform high precision color separation which is described later, it is necessary to use both of the first optical sensor 31a and the second optical sensor 31b as a pair of two sensors. The first optical sensor 31a and the second optical sensor 31b as a pair of two sensors are used and a calculation (subtraction) is performed based on the light reception data of the first optical sensor 31a and the light reception data of the second optical sensor 31b. As a result, a temperature compensation based on dark current or the like can be performed.

In case where touch sensing using the near infrared region is performed without the color separation, the first optical sensor 31a and the second optical sensor 31b may be omitted. When performing touch sensing using the near infrared region, only the second optical sensor 31b which comes through an overlapped portion formed between any one of a red filter RF, a green filter GF and a blue filter BF and the black matrix BM may optionally be used. In this case, the second optical sensor 31b may be formed such that one sensor for every one pixel, one sensor for every three pixels or one sensor for every six pixels is provided.

A thin film transistor of the composite oxide semiconductor used for a switching element of the first optical sensor 31a and the second optical sensor 31b can be used as a switching element (TFT) that drives liquid crystal with high speed and low power consumption. The transparent channel layer formed by two or more or three or more types of composite oxide semiconductor shows an amorphous state after being formed. After forming the transparent channel layer or after forming a pattern of the transparent channel layer, a heat treatment is applied within a range approximately from 250 to 500 degrees C. to crystallize the composite metal oxide, thereby stabilizing and homogenizing respective electrical characteristics of transistors. An annealing using a laser is performed on a part of a plurality of transistors (transparent channel layer) whereby transistors having different electrical characteristics such as a threshold voltage Vth can be formed on the same substrate. The heat-treatment condition of the metal oxide may preferably be in a high temperature range approximately from 400 to 600 degrees C. Practically, a temperature considering the heat resistance properties of a source electrode, a gate electrode or, for example, a metal wiring such as a gate wiring or an auxiliary capacitance line is a substantial upper limit of the temperature.

As a metal wiring, for example, a two layered copper wiring constituted of copper having heat resistance properties higher than aluminum and a metal (for example, titanium) having high melting point is used. Hence, the temperature of the heat treatment can use a high temperature range, for example, approximately 400 to 600 degrees C. Since copper has conductivity higher than that of aluminum, it is to suitable for TFT switching operation.

For the first optical sensor 31a and the second optical sensor 31b, when the metal wiring is a copper wiring, a bottom gate transistor structure can be employed in which a semiconductor layer (transparent channel layer of the above-described silicon semiconductors or oxide semiconductor is included) is formed on the gate electrode via the insulation layer.

Figure 12:
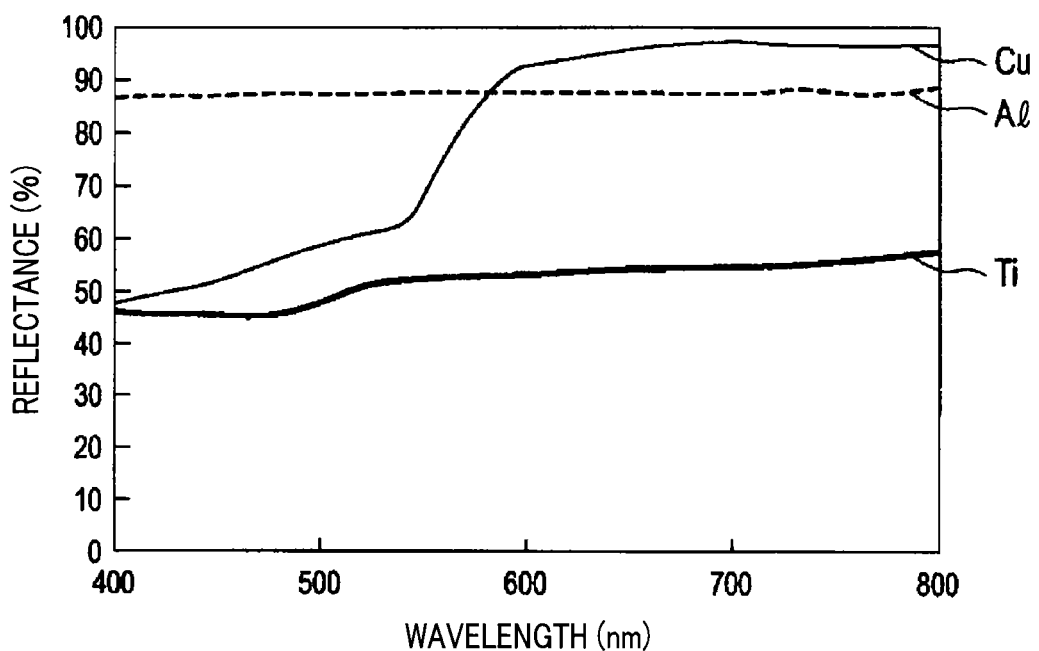
FIG. 12 is a graph showing an example of reflectance characteristics of copper, aluminum and titanium.

FIG. 12 is a graph showing an example of reflectance characteristics of copper (Cu), aluminum (Al) and titanium (Ti). In FIG. 12, the vertical axis represents the reflectance and the horizontal axis represents the wavelength.

Copper as a metal has high reflectance to light having a long wavelength, including the near infrared region. In the first optical sensor 31a and the second optical sensor 31b, when a configuration is employed in which copper as a metal is formed under the semiconductor layer which is a light reception layer, for example, a bottom gate transistor structure is employed, and re-reflected light from the copper in the under coating can be utilized so that the sensitivity of the optical sensor can be enhanced.

In a case where the first optical sensor 31a and the second optical sensor 31b have a photo diode configuration, a reflective pattern that reflects light such as infrared light may preferably be formed by using a metal wiring material including copper in the surface layer which is similar to the gate electrode. This reflective pattern may preferably be formed on the undercoating of the first optical sensor 31a and the second optical sensor 31b via the insulation layer. The insulation layer may be formed with silicon nitride (SiNx), silicon oxide (SiOx) or a mixture of these materials.

The wavelength at 50% transmittance (hereinafter referred to as half value wavelength) of the black matrix according to the present embodiment may be set to be approximately 700 nm like the transmittance characteristics BLK2 of the black matrix BM as shown in FIG. 6. The half value wavelength can be adjusted by combining organic pigments.

Figure 13:
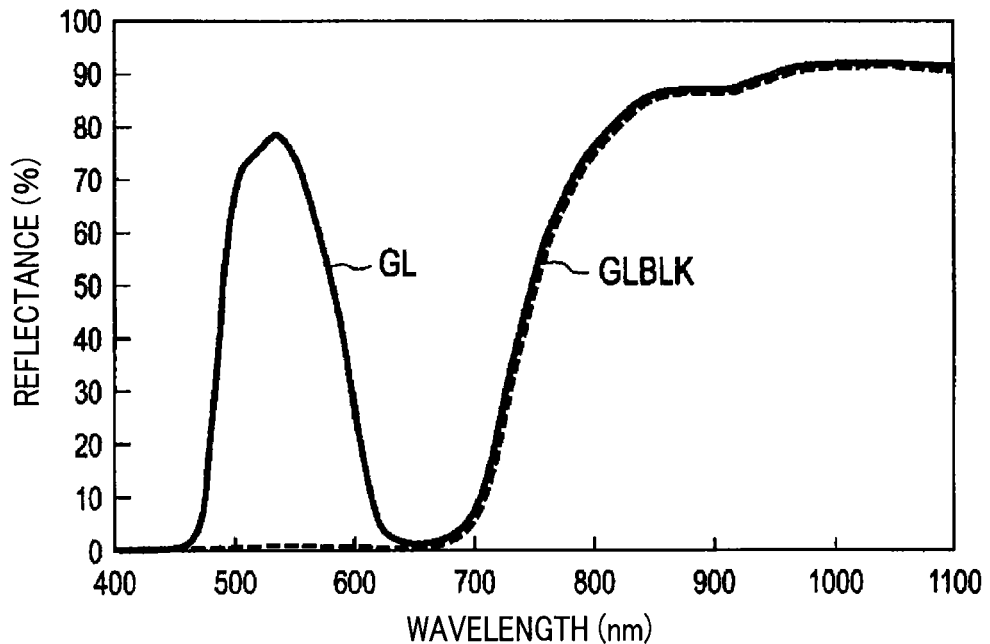
FIG. 13 is a graph showing an example of transmittance characteristics GL of a green filter and transmittance characteristics GLBLK where the green filter and the black matrix are overlapped.

FIG. 13 is a graph showing an example of transmittance characteristics GL of a green filter GF and transmittance characteristics GLBLK where the green filter GF and the black matrix BM (transmittance characteristics BLK2) are overlapped. In FIG. 13, the vertical axis represents the transmittance and the horizontal axis represents the wavelength.

The transmittance characteristics GL correspond to the light reception data of the first optical sensor 31a as shown in the above-described FIG. 11.

The transmittance characteristics GLGLK correspond to the light reception data of the second optical sensor 31b as shown in the above-described FIG. 11.

As for the high-precision green light reception data in the visible light region, light reception data detected by optically overlapping the green filter GF and the black matrix BM is subtracted from light reception data detected via the green filter GF to obtain the high-precision green light reception data. The calculation process of these data is executed by the processing unit 32 and the detection data of green only in the visible light region can be extracted.

Figure 14:
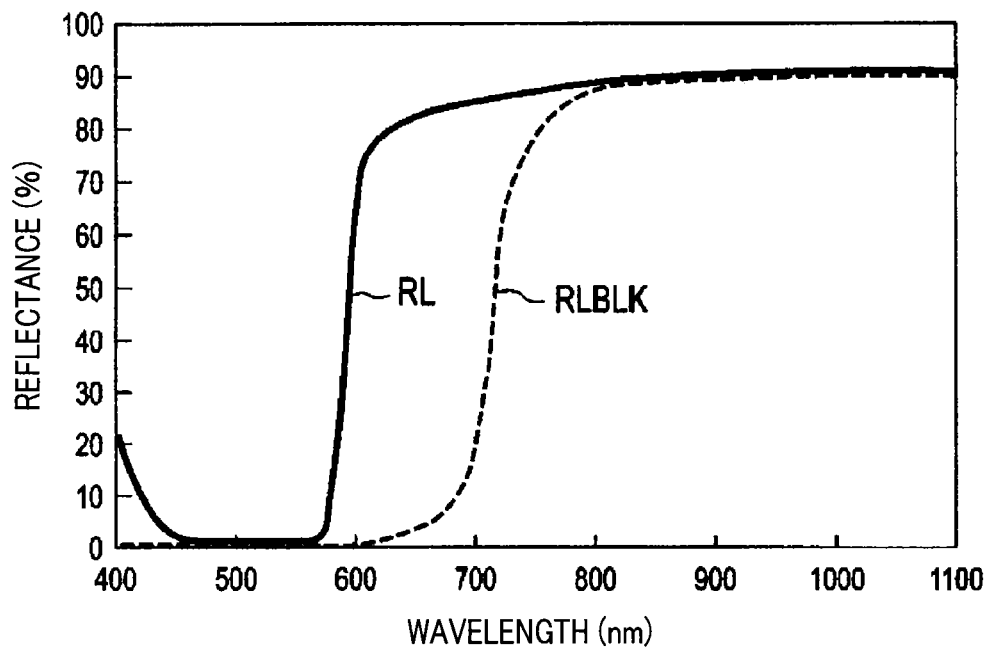
FIG. 14 is a graph showing an example of transmittance characteristics RL of a red filter and transmittance characteristics RLBLK where the red filter and the black matrix are overlapped.

FIG. 14 is a graph showing an example of transmittance characteristics RL of a red filter RF and transmittance characteristics RLBLK where the red filter RF and the black matrix BM (transmittance characteristics BLK2) are overlapped. In FIG. 14, the vertical axis represents the transmittance and the horizontal axis represents the wavelength.

The transmittance characteristics RL correspond to the light reception data of the first optical sensor 31a as shown in the above-described FIG. 11.

The transmittance characteristics RLGLK corresponds to the light reception data of the second optical sensor 31b as shown in the above-described FIG. 11.

As for the high-precision red light reception data in visible light region, the light reception data detected by optically overlapping the red filter RF and the black matrix BM is subtracted from light reception data detected via the red filter RF to obtain the high-precision red light reception data. The calculation process of these data is executed by the processing unit 32 and the detection data of red only in the visible light region can be extracted.

Figure 15:
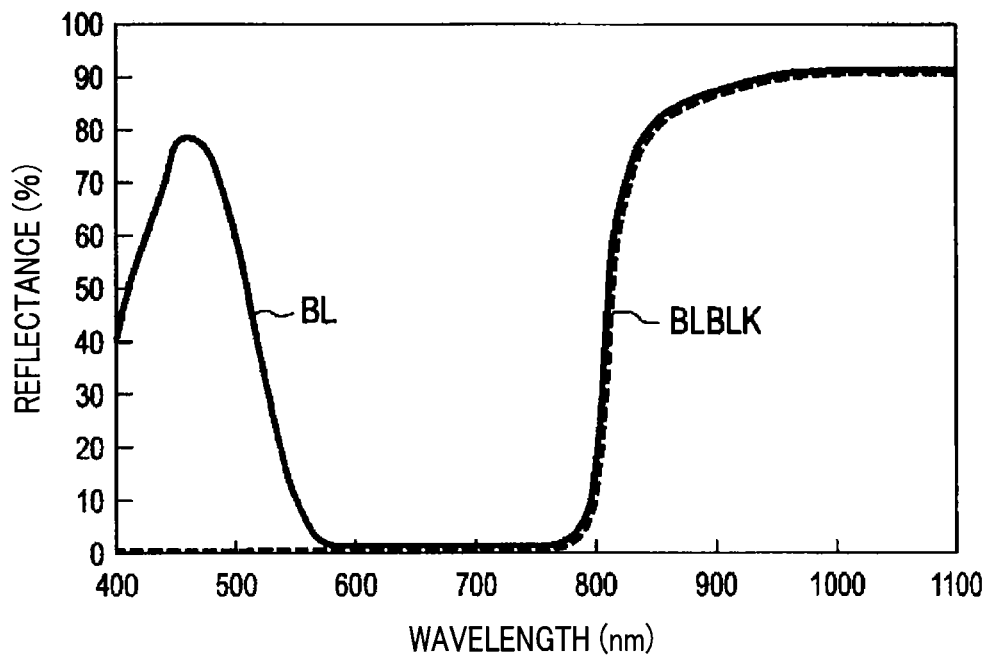
FIG. 15 is a graph showing an example of transmittance characteristics BL of a blue filter and transmittance characteristics BLBLK where the blue filter and the black matrix are overlapped.

FIG. 15 is a graph showing an example of transmittance characteristics BL of a blue filter BF and transmittance characteristics BLBLK where the blue filter BF and the black matrix BM (transmittance characteristics BLK2) are overlapped. In FIG. 15, the vertical axis represents the transmittance and the horizontal axis represents the wavelength.

The transmittance characteristics BL correspond to the light reception data of the first optical sensor 31a as shown in the above-described FIG. 11.

The transmittance characteristics BLGLK correspond to the light reception data of the second optical sensor 31b as shown in the above-described FIG. 11.

As for the high-precision blue light reception data in visible light region, light reception data detected by optically overlapping the blue filter BF and the black matrix BM is subtracted from light reception data detected via the blue filter BF to obtain the high-precision blue light reception data. The calculation process of these data is executed by the processing unit 32 and the detection data of blue only in the visible light region can be extracted.

In the subtraction of the light reception data of the first and second optical sensors 31a and 31b, when it is calculated, a dark current due to a change in the ambient temperature can be compensated. Hence, more precise light reception data can be extracted. When the incoming light is natural light such as the sunlight or dark indoor light, in order to conform to various light-reception conditions, a feedback control that adjusts a luminance of the liquid crystal display device 30 can be accomplished based on the high precision light reception data.

In a case where touch sensing with a near infrared region is provided, for example, light reception data of the second optical sensor 31b located under an overlapped portion formed between the blue filter BF and the black matrix BM is subtracted from light reception data of the second optical sensor 31b located under an overlapped portion formed between the red filter RF and the black matrix BM. Thus, light reception data within a range approximately from 700 nm to 800 nm can be extracted. By this calculation, at the same time, the dark current can be compensated as well.

The backlight unit 10 of the above-described FIG. 11 may include a solid light emitting element (LED) that emits red, green and blue light. For example, the backlight unit 10 performs time division (field sequential) light emission of red, green and blue, and a synchronous control with a liquid crystal drive corresponding to the pixel portion. Thus, a full-color display can be performed. Moreover, for example, the second optical sensor 31b is used for sensing the infrared light reception so as to employ a configuration in which an infrared light emission LED is added to the red LED, the green LED and the blue LED. In this case, touch sensing may be accomplished in which infrared light emitted from the infrared light LED is irradiated to a pointer such as a finger to observe the reflected light from the pointer at the second light optical sensor 31b.

As the first optical sensor 31a or the second optical sensor 31b of the liquid crystal display device 30 according to the present embodiment, when a silicon based photo diode is used, the photo diode may be a PIN diode or PN diode. When a PIN diode is used for the photo diode, a P-type region, an intrinsic region and an N-type region may be arranged in a horizontal direction of a surface of the transparent substrate or may be laminated in a vertical direction of the transparent substrate 13.

In the above-described present embodiment, an overlap between the green filter and the black matrix, an overlap between the red filter and the black matrix and an overlap between the blue filter and the black matrix are utilized, whereby high precision color separation can be performed.

The liquid crystal display device provided with a display device substrate according to the present embodiment, for example, may be provided in a color copier or may include a function of a color image capture or motion sensing. Therefore, the liquid crystal display device can be adapted for touch sensing using an infrared region and optical communication.

The liquid crystal display device according to the present embodiment is able to achieve high precision display of 300 ppi or more and can be used for a personal authentication system such as finger recognition.

Fifth Embodiment

The present embodiment is a modification of the above-described fourth embodiment. In the liquid crystal display device according to the present embodiment, the first optical sensor 31a and the second optical sensor 31b are photo diodes in which amorphous silicon semiconductor is used. According to the present embodiment, the first optical sensor 31a and the second optical sensor 31b are controlled by a transistor used as a switching element. The switching element is a transistor provided with a composite metal oxide semiconductor as a transparent channel, however, the switching element may be a transistor provided with a poly silicon transistor as a transparent channel.

According to the present embodiment, the liquid crystal layer 12 has liquid crystal molecules having an initial vertical alignment.

Figure 16:
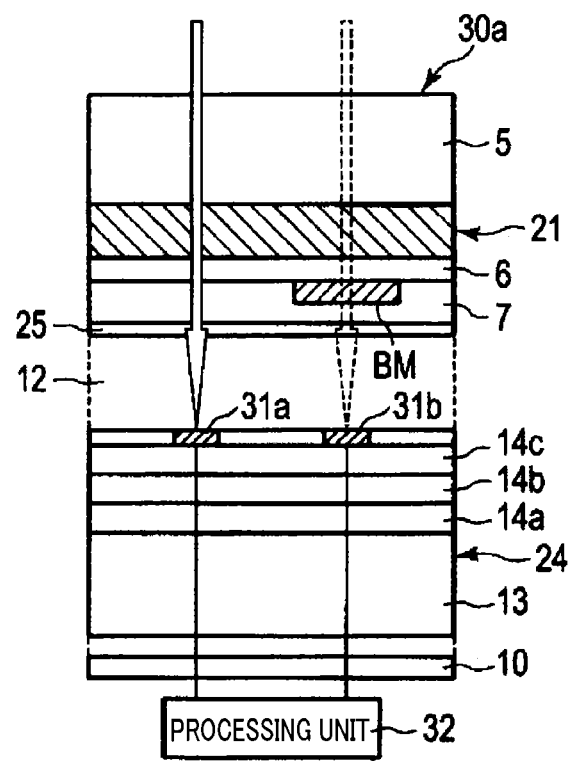
FIG. 16 is a cross sectional view showing a partial example of a liquid crystal display device according to fifth embodiment.

FIG. 16 is a cross sectional view showing a partial example of a liquid crystal display device 30a according to the present embodiment. In FIG. 16, a location where the first optical sensor 31a is formed and a location where the second optical sensor 31b is formed are different compared to the above-described FIG. 11. According to the present embodiment, the first optical sensor 31a and the second optical sensor 31b are formed on the insulation layer 14c.

It should be noted that a metal wiring, an output line, a power line, an electrode (including source electrode, drain electrode and gate electrode of transistor), a gate wiring and a signal line which are described later have a two layer laminated configuration including copper and titanium in which copper is disposed on the surface layer. The surface of the copper which is the surface layer faces towards the first optical sensor 31a and the second optical sensor 31b and the titanium surface face towards the backlight unit 10 which is not shown.

Figure 17:
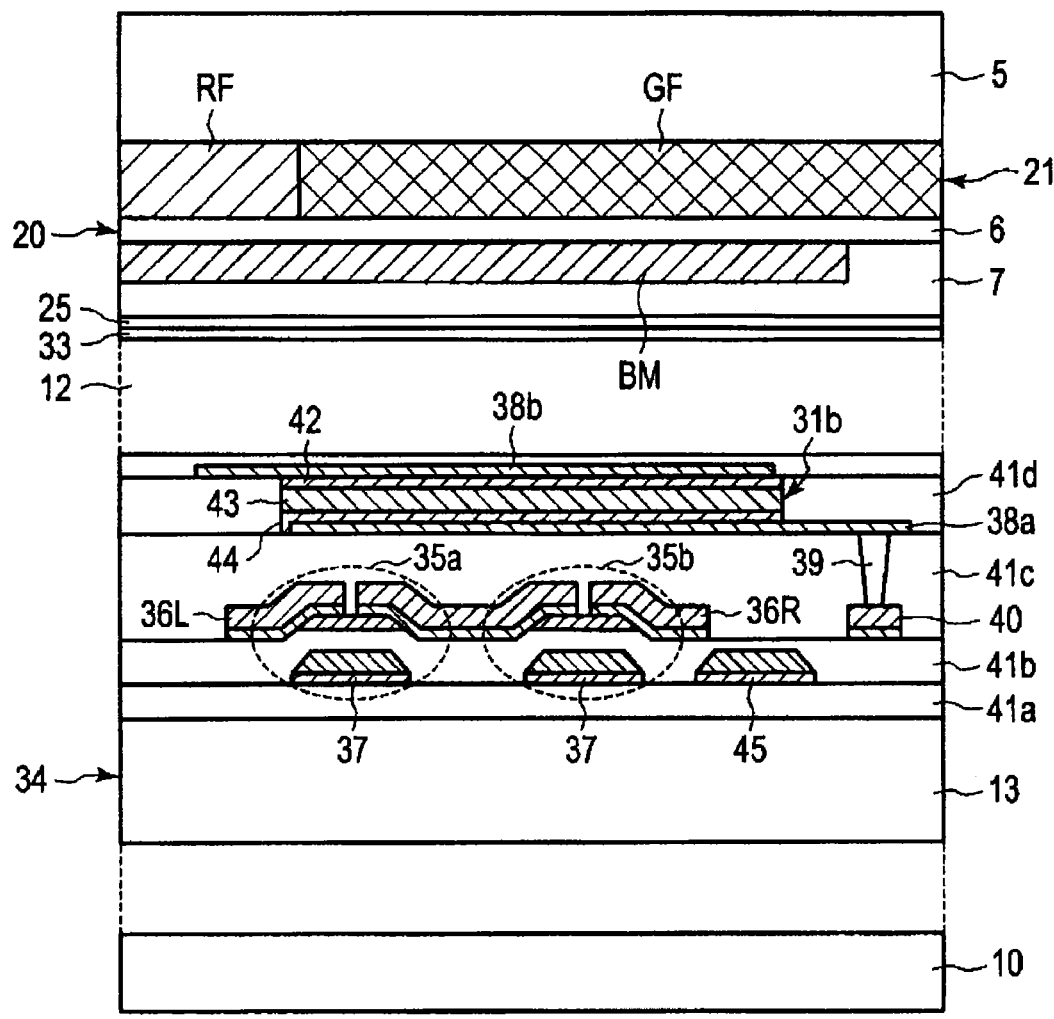
FIG. 17 is a cross sectional view showing an example of a configuration of a second optical sensor located at the underside of the black matrix and a configuration of two transistors which are control switching elements of the second optical sensor.

FIG. 17 is a cross sectional view showing an example of a configuration of a second optical sensor 31b located at the under side of the black matrix BM and a configuration of two transistors which are control switching element of the second optical sensor 31b.

The display device substrate 20 according to the present embodiment includes a common electrode 25 which is a transparent conductive film and an alignment film 33 on the second transparent resin layer 7.

An array substrate 34 according to the present embodiment includes an active element. The active element includes a liquid crystal drive element such as a transistor and a light receiving element such as an optical sensor. The light receiving element is disposed close to the backlight unit 10 and includes a metal wiring in which a metal is provided on the surface layer, having a high reflectance to light having a wavelength in a sensitivity region of the light receiving element.

The array substrate 34 is provided with a plurality of metal wirings such as a power line and an output line. The metal on the surface layer of the plurality of metal wirings has high reflectance to light having wavelength in the sensitivity region of the light receiving element.

The backlight unit 10 is disposed near a back surface of the array substrate 34 which is opposite to a liquid crystal layer 12 side of the array substrate 34 and emits visible light and light having a wavelength in a sensitivity region of the light receiving element.

One electrode 36L that constitutes two transistors 35a and 35b is electrically connected to an output line (not shown) and outputs light reception data of the optical sensor 31a via the output line. The other electrode 36R of the two transistors 35a and 35b is connected to the power line.

As for the two transistors 35a and 35b, functions thereof can be switched depending on a connecting direction of the above-described output line and the power line. For example, in case where the electrode 36L is connected to the power line and the light reception data is outputted from the electrode 36R, the transistor 35a serves as a selection transistor. The gate electrode 37 located under the transistor 35a is applied with a selection signal from the gate wiring and the transistor 35b serves as an amplifying transistor. The light reception data of the second optical sensor 31b is amplified and outputted from the electrode 36R.

The second optical sensor 31b is electrically connected to the electrode 36R through a lower electrode 38a, a contact hole 39 and the metal wiring 40. An upper electrode 38b of the second optical sensor 31b is electrically connected to a common electrode wiring via the contact hole which is not shown. For example, the insulation layers 41a to 41d may be formed with silicon oxide, silicon oxynitride, aluminum oxide and a mixture of oxide containing these materials or acrylic resin having sensitivity and capable of being developed with alkali.

The second optical sensor 31b and the first optical sensor 31a (not shown in FIG. 17) have a configuration in which amorphous silicon 42 of a P-type semiconductor, amorphous silicon 43 of intrinsic semiconductor (I type) and amorphous silicon 44 of an N-type semiconductor are laminated from above as shown in FIG. 17. The upper electrode (conductive film) 38b having optical transparency and the lower electrode 38a are formed on the upper surface of the amorphous silicon 42 of the P-type semiconductor and the lower surface of the amorphous silicon 44 of the N-type semiconductor respectively. The upper electrode 38b and the lower electrode 38a may be formed with a conductive metal oxide which is for example ITO.

In the under side of the second optical sensor 31b according to the present embodiment, a transistor and a metal wiring and a metal wiring 45 as a dummy pattern are formed. The metal wiring 45 as a dummy pattern is, in planar view, a pattern formed to cover the under part of the optical sensor 31b without any gaps and is electrically isolated from the metal wiring, the output line, the power line, the electrode, the gate line, the signal line or the like. The metal wiring 45 as a dummy pattern is formed to reflect light coming from an observation surface of the liquid crystal display device, thereby improving the sensitivity of the second optical sensor 31b. The film thickness of the copper is, for example, 300 nm and the film thickness of the titanium is, for example, 10 nm. The titanium can be substituted by another metal having high melting point such as tungsten. The copper can be substituted to use aluminum or aluminum alloy, when the wavelength of light which is an object used for sensing is in visible light region.

As for the second optical sensor 31b described in the present embodiment, the light reception sensitivity can be increased in order to further observe the reflected light from a metal film having high optical reflectance such as copper located under the second optical sensor 31b.

According to the present embodiment, for example, fine irregularities may be provided on the surface of the metal film having high optical reflectance such as copper so as to improve the light absorption of the second optical sensor 31b.

In the present embodiment, a plurality of columns of which the diameter is in the range of the light wavelength may be formed on the surface of the metal film having high optical reflectance with a transparent resin having different refractive index so as to improve the light absorption of the second optical sensor 31b.

According to the present embodiment, as an active element, for example, a thin film transistor, a photo diode and a photo transistor are used. The metal wiring where copper or aluminum is used for the surface layer represents that the surface layer close to the photo diode or the photo transistor is copper or aluminum. The surface layer of the metal wiring close to the light reception surface of the light receiving element is, for example, copper or titanium. The reflectance is decreased when copper, aluminum or titanium contains 3% or more of dissimilar metal or impurities. Accordingly, metal having copper as a base material may contain 3% or less of dissimilar metal or impurities, which causes less effect on the decrease of the reflectance. In other words, according to the present embodiment, copper or aluminum which contains less than 3% of dissimilar metal or impurities. As a dissimilar metal capable of applying to the copper, for example, magnesium, aluminum, indium and tin may be employed.

According to the present embodiment, the optical sensor 31b is described as an example. However, the same configuration can be applied to the first optical sensor 31a.

Sixth Embodiment

According to the present embodiment, a transparent resin and organic pigments used for the above-described first to fifth embodiments are exemplified.

<Transparent Resin>

A photo sensitive colored composition used for forming the color filter 21 constituted of the frame portion 2, the black matrix BM and a pixel pattern including the red filters RF, the green filters GF and the blue filters BF contains polyfunctional monomer, a photo sensitive resin, or non-photo sensitive resin, polymerization initiator and solvent in addition to pigment dispersant (hereinafter referred to as paste). For example, according to the present embodiment, an organic resin having high transparency such as a photo sensitive resin or non-photo sensitive resin are generally referred to as transparent resin.

As a transparent resin, thermoplastic resin, thermosetting resin or photosensitive resin can be used. As a thermoplastic resin, for example, butyral resin, styrene-maleic acid copolymer, chlorinated polyethylene, chlorinated polypropylene, polyvinyl chloride, polyvinyl chloride-vinyl acetate copolymer, polyvinyl acetate, polyurethane-based resin, polyester resin, acrylic resin, alkyd resin, polystyrene resin, polyamide resin, rubber based resin, cyclized rubber based resin, cellulose compounds, polybutadiene, polyethylene, polypropylene, polyimide resin or the like can be employed.

As the thermosetting resin, for example, epoxy resin, benzoguanamine resin, rosin-modified maleic acid resin, rosin-modified fumaric acid resin, melamine resin, urea resin, phenol resin or the like can be used. The thermosetting resin may be produced by reacting a melamine resin with a compound containing isocyanate group.

<Alkali Soluble Resin>

To form the frame portion 2, the black matrix BM, the first transparent resin layer 6, the second transparent resin layer 7 and the color filter 21 according to the present embodiment, a photo sensitive resin composite which is capable of forming a pattern by photolithography may preferably be used. These transparent resins may preferably be a resin where alkali soluble properties are applied. As the alkali soluble resin, a resin containing carboxyl group or hydroxyl group may be used or other resin may be used. As the alkali soluble resin, for example, epoxy acrylate based resin, novolac based resin, polyvinyl phenol resin, acrylic resin, epoxy resin containing carboxyl group, urethane resin containing carboxyl group can be used. Among these resins, as an alkali soluble resin, epoxy acrylate based resin, novolac based resin, acrylic resin may preferably be used. More preferably, epoxy acrylate based resin or novolac based resin may be used.

<Acrylic Resin>

As a typical transparent resin capable of being used for the present embodiment, the following acrylic resins are exemplified.

As an acrylic resins, as a monomer, for example, (meth) acrylic acid; alkyl (meth) acrylates such as methyl (meth) acrylate, ethyl (meth) acrylate, propyl (meth) acrylate, butyl (meth) acrylate, t-butyl (meth) acrylate benzyl (meth) acrylate and lauryl (meth) acrylate; (meth) acrylates containing hydroxyl groups such as hydroxyl ethyl (meth) acrylate and hydroxyl propyl (meth) acrylate; (meth) acrylates containing ether groups such as ethoxyethyl (meth) acrylate, glycidyl (meth) acrylate; and cycloaliphatic (meth) acrylate such as cyclohexyl (meth) acrylate, isobornyl (meth) acrylate and dicyclopentenyl (meth) acrylate may be employed to obtain polymer.

A single monomer or two or more monomers selected from the monomers exemplified by these materials can be used.

Moreover, acrylic resin may be produced by using a copolymer including a compound containing styrene, cyclohexylmaleimide or phenylmaleimide which can be copolymerized with monomers of these materials. Also, for example, a copolymer obtained by copolymerizing carboxylic acid having ethylenically unsaturated groups such as (meth) acrylic acid, and a compound containing epoxy groups such as glycidyl methacrylate and unsaturated double bonds may be reacted to produce a resin having photosensitive properties, thereby obtaining acrylic resin. For example, a compound containing carboxylic acid such as (meth) acrylic acid may be added to a polymer of acrylate containing epoxy group such as glycidyl methacrylate or a copolymer of this polymer and other (meth) acrylate so as to produce a photosensitive resin to be the acrylic resin.

(Organic Pigment)

As a red pigment, for example, C.I. Pigment Red 7, 9, 14, 41, 48:1, 48:2, 48:3, 48:4, 81:1, 81:2, 81:3, 97, 122, 123, 146, 149, 168, 177, 178, 179, 180, 184, 185, 187, 192, 200, 202, 208, 210, 215, 216, 217, 220, 223, 224, 226, 227, 228, 240, 242, 246, 254, 255, 264, 272, 279 and the like can be used.

As a yellow pigment, for example, C.I. Pigment Yellow 1, 2, 3, 4, 5, 6, 10, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 144, 146, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214 and the like can be used.

As a blue pigment, for example, C.I. Pigment Blue 15, 15:1, 15:2, 15:3, 15:4, 15:6, 16, 22, 60, 64, 80 and the like can be used. Among these pigments, C.I. Pigment Blue 15:6 may preferably be used.

As a violet pigment, for example, C.I. Pigment Violet 1, 19, 23, 27, 29, 30, 32, 37, 40, 42, 50 and the like can be used. Among these pigments, C.I. Pigment 23 may preferably be used.

As a green pigment, for example, C.I. Pigment Green 1, 2, 4, 7, 8, 10, 13, 14, 15, 17, 18, 19, 26, 36, 45, 48, 50, 51, 54, 55, 58 and the like can be used. Among these pigments, C.I. Pigment Green 58 which is a halogenated zinc phthalocyanine green pigment may preferably be used. As a green pigment, halogenated aluminum phthalocyanine pigment may be used.

<Colorant of Frame Portion 2 and Black Matrix BM>

A light shielding colorant included in the frame portion 2 and the black matrix BM is provided with a light shielding properties, having absorption properties in the visible light wavelength region. As for the light shielding colorant according to the present embodiment, for example, an organic pigment, inorganic pigment or dye can be used. As an inorganic pigment, for example, carbon black, or oxide titanium can be used. As a dye, an azo-based dye, anthraquinone-based dye, phthalocyanine-based dye, quinone imine-based dye, quinoline-based dye, nitro-based dye, carbonyl-based dye, methane-based dye and the like can be used. As an organic pigment, for example, the above-described organic pigments may be applied. As for these light shielding colorant, one type of colorant or a colorant in which two or more types of colorants are combined with an appropriate ratio may be used.

For example, visible light wavelength region is defined as light wavelength approximately, from 400 nm to 700 nm.

The wavelength at which the transmittance of the black matrix according to the present embodiment rises can be adjusted to be within approximately a light wavelength from 670 nm to approximately a light wavelength of 800 nm, based on at least one of a change in the combination of the organic pigments and adjustment of an addition amount. At a light wavelength of approximately 670 nm, the transmittance of the red filter RF can be maintained to be high. A light wavelength approximately 800 nm is a rising edge portion where the transmittance of the blue filter BF becomes high.

<Example of Black Resist 1 Applied to Frame Portion 2>

An example of producing a black paste (dispersant) used for the frame portion 2 will be described.

A mixture having the following composition is uniformly stir-mixed and stirred by a beads mill dispersing machine to produce the black paste. The respective composition is represented by pts. mass.

carbon pigment 20 pts.
dispersant 8.3 pts.
copper phthalocyanine derivative 1.0 pts.
propylene glycol monomethyl ether acetate 71 pts.

By using the above-described black paste, a mixture having the following composition is uniformly stir-mixed and filtered by a 5 μm filter so as to produce the black resist 1 which is applied to the frame portion 2.

According to the present embodiment, the resist represents photosensitive colored composition including carbon or a pigment.

black paste 25.2 pts.
acrylic resin solution 18 pts.
dipentaerythritol penta and hexa acrylate 5.2 pts.
photoinitiator 1.2 pts.
sensitizer 0.3 pts.
leveling agent 0.1 pts.
cyclohexznone 25 pts.
propylene glycol monomethyl ether acetate 25 pts.

In the present embodiment and the above-described respective embodiments, the major colorant included in the black resist 1 or a color resist is a colorant that accounts for 50% of the entire mass ratio (%) of the colorant included in the resist.

For example, in the black resist 1, carbon accounts for 100% of the colorant so that carbon is determined as the major colorant. Also, in order to adjust the color tone or the reflected color, with approximately 10% or less of the entire mass ratio, an organic pigment such as red, yellow and blue may be added to the black resist of which the major colorant is carbon.

<Example of Black Resist 2 Used for Black Matrix BM>

An example of a mixture of organic pigments used for the black matrix BM is described as follows.

C.I. pigment red 254 (hereinafter abbreviated to as R254)
C.I. pigment yellow 139 (hereinafter abbreviated to as Y139)
C.I. pigment violet 23 (hereinafter abbreviated to as V23)

In these three pigments, R254 pigment may be omitted. Further, other than these three pigments, in order to adjust the color (transmission wavelength), a small amount of other type of pigments, for example, the above-described organic pigment may be added to be 20% mass or less. For example, a halogenated zinc phthalocyanine pigment, halogenated copper phthalocyanine pigment or halogenated aluminum phthalocyanine pigment may preferably be added to be a small amount, e.g., 20% mass or less in order to adjust a rising of the spectral characteristics (adjusting spectral characteristics curve) corresponding to a light wavelength of 700 nm.

The black matrix BM may preferably have a transmittance in the visible light region of 5% or less. Usually, the visible light region ranges approximately from light wavelength 400 nm to 700 nm. In order to set the half value wavelength of the black matrix BM to be within a range of light wavelength from 670 nm to 750 nm, the infrared-light transmittance characteristics are required to rise at a light wavelength around 660 nm and become high in a long wavelength region. The wavelength range corresponding to low transmittance of the black matrix BM may range approximately from light wavelength 400 nm to 650 nm.

It should be noted that the transmittance of the black matrix BM can be controlled extremely easily to be 5% or less in a range of the light wavelength approximately from 400 nm to 650 nm. This is accomplished by increasing the amount of pigment included in the black matrix or controlling the film thickness of the black matrix BM to be thicker. A position of the wavelength corresponding to the half value wavelength can readily be adjusted similarly by controlling the amount of pigment, the composition ratio of violet pigment, green pigment, yellow pigment and red pigment, and film thickness of the black matrix BM. As a green pigment applied to the black matrix BM, various green pigments can be employed. As a green pigment to set the half value wavelength of the black matrix BM to be a light wavelength range from 680 nm to 800 nm, a green pigment in which the rising of the infrared transmittance (e.g., half value wavelength) is within a light wavelength range from 700 nm to 800 nm may preferably be used. The half value wavelength can be adjusted to be within a light wavelength range from 680 nm to 800 nm based on mainly violet pigment and green pigment. A blue pigment may be added in order to adjust the half value wavelength of the black matrix BM. Instead of using a violet pigment in the example of a mixture of the organic pigments, for example, a blue pigment C.I. pigment blue 15:6 can be used so as to adjust the half value wavelength to be within 800 nm. For example, a small amount of the above-described green pigment or a blue pigment of C.I. pigment blue 15:3 can be further added to a mixture of organic pigments such as the following R254, Y139 and V23, thereby adjusting the position of the half value wavelength within in a range from 680 nm to 800 nm.

For example, a mass ratio (%) of R254 may be in a range from 0 to 15%.

For example, a mass ratio (%) of Y139 may be in a range from 25 to 50%.

For example, a mass ratio (%) of V23 may be in a range from 35 to 75%.

With a film thickness of the black matrix BM, e.g., around 1 μm of film thickness, violet pigment of V23 is added to the black matrix BM with any value selected from a range from 35 to 75%. Thus, the black matrix BM has a half value wavelength in a longer wavelength region than a light wavelength of 670 nm. By determining the yellow pigment to be any value selected from 25 to 50% and adding/mixing the red pigment to be 0 to 15%, the transmittance of the black matrix BM at light wavelength 400 nm to 660 nm can be sufficiently lowered. The light reception data of the second optical sensor 31b is subtracted from the light reception data of the first optical sensor 31a, whereby the transmittance of the black matrix BM can be prevented from slightly increasing in a range of the light wavelength approximately from 400 nm to 660 nm (transmittance of the black matrix BM is prevented from slightly increasing from the base line showing 0% of the transmittance in the spectral characteristics). Hence, accurate color separation can be performed.

Generally, before producing the color resist (colored composition) according to these pigments, the pigments are dispersed into resin or solution so as to produce a pigment paste (dispersant). For example, in order to disperse a single pigment Y139 into the resin or the solution, the following materials are mixed with respect to pigment R139 7 pts (pts. mass).

acrylic resin solution (solid content 20%) 40 pts.
dispersant 0.5 pts.
cyclohexanone 23.0 pts.

Other pigments such as V23 and R254 may be dispersed into the same resin or the solution so as to produce the black color pigment paste dispersant.

A composition ratio for producing the black resist 2 according to the above-described pigment paste dispersant is exemplified as follows.

Y139 paste 14.70 pts.
V23 paste 20.60 pts.
acrylic resin solution 14.00 pts.
acrylic monomer 4.15 pts.
initiator 0.7 pts.
sensitizer 0.4 pts.
cyclohexanone 27.00 pts.
PGMAC 10.89 pts.

The black resist 2 used for the black matrix BM is formed with the above-described composition ratio.

The black resist 2 which is the major colorant of the pigment used for forming the black matrix BM is violet pigment V23 which accounts for 58% of the entire mass ratio (%). Most organic pigments have high transmittance in a wavelength region longer than a light wavelength of approximately 800 nm. Similarly, the yellow pigment Y139 is an organic pigment having high transmittance in a wavelength region longer than a light wavelength of 800 nm.

For example, the major colorant of the black resist 2 may be 100% organic pigment. Alternatively, in the black resist 2 having organic pigment as a major colorant, carbon may be added to be approximately 40% or less of the entire mass so as to adjust the light shielding properties.

A colored resist including the above-described black resist can be coated on the transparent substrate, thereby forming a pattern with a well-known photolithography process. Alternatively, a dry etching process can be used to form the pattern by using novolac based photo-sensitive resist.

In the black resist 1 containing carbon as a major colorant, other than frame portions, alignment marks are aligned for forming the pattern. It is possible to perform the alignment by using the alignment marks after coating the black resist 2. As for the alignment marks, for example, a difference D1 of the transmittance at light wavelength 850 nm is utilized as shown in FIG. 6 so as to recognize the alignment marks by using infrared light and an infrared camera.

The display device substrates 1, 20 and 27 according to the above-described respective embodiments can be applied in various ways as a display device provided with a display device substrate. As electronic devices where the display device substrates 1, 20 and 27 according to the above-described respective embodiments can be provided, for example, there are cellular phones, portable game equipment, portable information terminals, personal computers, electronic books, camcorders, digital still cameras, head mounted displays, navigation systems, sound reproduction systems (car audio, digital audio players, etc), copying machines, facsimile equipment, printers, printer-composite machines, bending machines, automatic teller machines (ATMs), personal authentication devices, optical communication equipment and the like.

The above-described respective embodiments can be modified in various ways without departing the scope of the invention. The above-described respective embodiments can be combined freely.

A black matrix arranged closely to the color filter of the display device has effects in which light leakage is prevented from occurring in the vicinity of a region between adjacent pixels, improving the contrast of the display. However, for a high definition liquid crystal display device or organic EL display device having 300 ppi or more, the pixel width approaches closely to the thickness of the functional portion performing the display in the thickness direction of the display device, so that light leakage in an oblique direction is likely to occur. Here, in the case of liquid crystal, the thickness of the functional block serving as the display corresponds to the thickness of the liquid crystal layer, and in the case of an organic EL device, the thickness of the functional block serving as the display corresponds to the thickness of the light emitting portion including electrodes.

The present invention has been achieved in light of the above-described circumstances and its object is to provide a display device substrate and a display device capable of suppressing light leakage in oblique directions.

A display device substrate according to a first aspect of the present invention is provided with a transparent substrate, a frame portion, a first transparent resin layer, a black matrix and a second transparent resin layer. The frame portion is provided on the transparent substrate and formed in a frame region that surrounds a display region, containing carbon as a major colorant and having light shielding properties. The first transparent resin layer is formed on the transparent substrate in which the frame portion is formed. The black matrix is formed on the first transparent resin layer, dividing the display region into a plurality of openings having a matrix shape and containing an organic pigment as a major colorant. The second transparent resin layer is formed on the first transparent resin layer on which the black matrix is formed.

According to the display device substrate according to the first aspect of the present invention, a color filter may preferably be provided between the transparent substrate and the first transparent resin layer, the color filter including red filters, green filters and blue filters.

The display device according to a second aspect of the present invention is provided with the display device substrate according to the above-described first aspect.

The display device according to the second aspect of the present invention is provided with an array substrate which is provided with a plurality of metal wirings and a plurality of active elements. The display device substrate and the array substrate face each other via a liquid crystal layer therebetween and the plurality of active elements include a liquid crystal drive element and a light receiving element. A metal on a surface layer of the plurality of metal wirings has high reflectance to light having wavelength in a sensitivity region of the light receiving element.

The display device may preferably further includes a backlight unit disposed near a back surface of the array substrate which is opposite to a liquid crystal layer side of the array substrate, the backlight unit emitting visible light and light having wavelength in a sensitivity region of the light receiving element.

In the display device according to the second aspect of the present invention, the light receiving element may preferably be disposed close to the backlight unit and may preferably include a metal wiring in which a metal is provided on the surface layer, having high reflectance to the light having the wavelength in a sensitivity region of the light receiving element.

The display device according to a third aspect of the present invention is provided with a display device substrate, an array substrate including a plurality of metal wirings and a plurality of active elements. The display device substrate includes: a transparent substrate; a color filter formed on the transparent substrate, including red filters, green filters and blue filters; a first transparent resin layer formed on the color filter; a black matrix formed on the first transparent resin layer, dividing the display region into a plurality of openings having a matrix shape and including an organic pigment as a major colorant; and a second transparent resin layer formed on the first transparent resin layer on which the black matrix is formed. The display device substrate and the array substrate face each other via a liquid crystal layer therebetween and the plurality of active elements include a liquid crystal drive element and a light receiving element. A metal on a surface layer of the plurality of metal wirings has high reflectance to light having wavelength in a sensitivity region of the light receiving element. The display device further includes a backlight unit disposed near a back surface of the array substrate which is opposite to a liquid crystal layer side of the array substrate, the backlight unit emitting visible light and light having wavelength in a sensitivity region of the light receiving element.

In the display device according to the third aspect of the present invention, the metal on a surface layer of the plurality of metal wirings may preferably be copper or copper containing less than 3% of dissimilar metal or impurities, or aluminum containing less than 3% of dissimilar metal or impurities.

According to the aspects of the present invention, light leakage in the oblique direction can be suppressed.

REFERENCE SIGNS LIST 1, 20, 27: display device substrate
2: frame portion
3: display region
4: frame portion
5: transparent substrate
6: first transparent resin layer BM: black matrix
7: second transparent resin layer
OW: width of opening
8, 22, 28, 30, 30a: liquid crystal display device
9, 91: liquid crystal panel
10: backlight unit
11, 24, 34: array substrate
12: liquid crystal layer
13: transparent substrate
14a to 14c, 41a to 41d: insulation layer
15: common electrode
16: pixel electrode
17a, 17b: misaligned regions
21: color filter
23: pixel electrode
25: common electrode
29a, 29b: sensing electrode
31a, 31b: optical sensor
32: processing unit
33: alignment film
35a, 35b: transistor
36L, 36R: electrode
37: gate electrode
38a: lower electrode
38b: upper electrode
39: contact hole
40, 45: metal wiring Obviously, numerous modifications and variations of the present invention are possible in light of the above teachings. It is therefore to be understood that within the scope of the appended claims, the invention may be practiced otherwise than as specifically described herein.

What is claimed is:

1. A display device, comprising:
a display device substrate having a display region and a frame region surrounding the display region;
a liquid crystal layer;
an array substrate that faces the display device via the liquid crystal layer, the array substrate including a plurality of metal wirings and a plurality of active elements,
wherein the active elements include a liquid crystal drive element and a light receiving element,
the liquid crystal drive element is disposed underneath the light receiving element,
the metal wirings comprise a copper metal on a surface thereof, which reflects a light having a wavelength in a sensitivity region of the light receiving element,
the display device substrate includes
a transparent substrate,
a color filter formed on the transparent substrate and including a red filter, a green filter and a blue filter,
a first transparent resin layer formed on the color filter,
a black matrix formed on the first transparent resin layer such that the display region is divided into a plurality of openings in a matrix form, the black matrix including at least one organic pigment, including C.I. pigment violet 23, as a major colorant,
a second transparent resin layer formed on the first transparent resin layer on which the black matrix is formed, and
a backlight unit disposed near a back surface of the array substrate which is opposite to a side where the liquid crystal layer is formed, the backlight unit being configured to emit a visible light and a light having a wavelength in the sensitivity region of the light receiving element.

2. The display device according to claim 1, wherein the at least one organic pigment comprises a plurality of organic pigments.

3. The display device according to claim 1, wherein the liquid crystal drive element includes a channel layer comprising a composite oxide, and the light receiving element comprises an amorphous silicon semiconductor.

4. The display device according to claim 1, wherein the light receiving element is a composite metal oxide semiconductor.

* * * * *